(12) United States Patent
Choi et al.

(10) Patent No.: US 7,830,974 B2
(45) Date of Patent: Nov. 9, 2010

(54) DIGITAL TELEVISION TRANSMITTER/RECEIVER AND METHOD OF PROCESSING DATA IN DIGITAL TELEVISION TRANSMITTER/RECEIVER

(75) Inventors: In Hwan Choi, Gyeonggi-do (KR); Kyung Won Kang, Seoul (KR); Hyoung Gon Lee, Seoul (KR); Sung Ryong Hong, Gyeonggi-do (KR)

(73) Assignee: LG Electronics, Inc., Seoul (KR)

( * ) Notice: Subject to any disclaimer, the term of this patent is extended or adjusted under 35 U.S.C. 154(b) by 964 days.

(21) Appl. No.: 11/456,764

(22) Filed: Jul. 11, 2006

(65) Prior Publication Data

US 2007/0098107 A1 May 3, 2007

(30) Foreign Application Priority Data

Oct. 31, 2005 (KR) ...................... 10-2005-0103548

(51) Int. Cl.
| | |
|---|---|
| H04L 5/12 | (2006.01) |
| H04L 23/02 | (2006.01) |
| H04K 1/10 | (2006.01) |
| H04L 27/00 | (2006.01) |
| H04L 27/28 | (2006.01) |

(52) U.S. Cl. .................. 375/265; 375/259; 375/260; 375/261

(58) Field of Classification Search ................. 375/265, 375/295, 261, 260, 259, 240, 240.01, 240.27, 375/240.26

See application file for complete search history.

(56) References Cited

U.S. PATENT DOCUMENTS 6,816,204 B2 11/2004 Limberg (Continued)

FOREIGN PATENT DOCUMENTS

CN 1346212 4/2002

(Continued)

OTHER PUBLICATIONS

Touzni A et al: "Enhanced 8-VSB transmission for north-american HOTV terrestrial broadcast" PROC. 2003 IEEE International Conference on Acoustics. Speech. and Signal Processing, Proceedings. (ICASSP). Hong Kong, Apr. 6-10, 2003. IEE International Conference on Acoustics, Speech, and Signal Processing (ICASSP), New York, NY: IEEE, US. vol. vol. 1 of 6, Apr. 6, 2003, pp. 437-440, XP010640975 ISBN: 0-7803-7663-3 p. 438-439 Figures 2-4.

(Continued)

*Primary Examiner*—David C Payne
*Assistant Examiner*—Erin M File
(74) *Attorney, Agent, or Firm*—Lee, Hong, Degerman, Kang & Waimey

(57) ABSTRACT

A digital television transmitter and a method of coding main and enhanced data in the digital television transmitter are disclosed. In the digital television transmitter, a byte-symbol converter converts main and enhanced data packets into symbols, wherein at least one of the enhanced data packets may include data place holders for known data symbols. A known data generator generates a known data symbol. A symbol processor processes a first symbol outputted from the byte-symbol converter. Herein, the symbol processor may post-decode a first bit of the known data symbol and output the post-decoded bit and an initialization data bit when the first symbol is a symbol representing one of the place holders. A trellis encoder has one or more memories for trellis-encoding a second symbol outputted from the symbol processor, wherein the memories are initialized when the initialization data bit is processed in the trellis encoder.

24 Claims, 19 Drawing Sheets

U.S. PATENT DOCUMENTS

| | | | |
|---|---|---|---|
| 7,356,549 B1 * | 4/2008 | Bruso et al. | 1/1 |
| 2002/0186790 A1 * | 12/2002 | Choi et al. | 375/321 |
| 2003/0099303 A1 | 5/2003 | Birru | |
| 2004/0090997 A1 | 5/2004 | Choi et al. | |
| 2006/0088119 A1 * | 4/2006 | Fu et al. | 375/265 |
| 2006/0104391 A1 * | 5/2006 | Choi et al. | 375/341 |
| 2006/0140301 A1 * | 6/2006 | Choi et al. | 375/270 |
| 2006/0253890 A9 * | 11/2006 | Park et al. | 725/148 |
| 2007/0091885 A1 * | 4/2007 | Yu et al. | 370/389 |
| 2007/0268979 A1 * | 11/2007 | Chang et al. | 375/265 |
| 2009/0111486 A1 * | 4/2009 | Burstrom | 455/456.3 |

FOREIGN PATENT DOCUMENTS

| | | |
|---|---|---|
| CN | 1622606 | 6/2005 |
| CN | 1522067 | 8/2005 |
| KR | 10-2003-0026236 | 3/2003 |

OTHER PUBLICATIONS

Gaddam V R et al: "A Newly Proposed ATSC DTV System for Transmitting a Robust Bit-Stream Along With the Standard Bit-Stream" IEEE Tansactions on Consumer Electronics, IEEE Service Center, New York, NY, US, vol. 49, No. 4. Nov. 2003, pp. 933-938, XP001201224 issn: 0096-3063 * p. 934, right-hand column—p. 936, right-hand column * * figures 2,3*.

* cited by examiner

| C2C1C0 | VSB Level |
|--------|-----------|
| 111    | +7        |
| 110    | +5        |
| 101    | +3        |
| 100    | +1        |
| 011    | -1        |
| 010    | -3        |
| 001    | -5        |
| 000    | -7        |

Byte Expansion by null bit insertion (1 byte => 2 bytes)

Byte Expansion by null bit insertion (1 byte => 2 bytes)

Byte Expansion by bit repetition (1 byte => 2 bytes)

Byte Expansion by null bit insertion (1 byte => 4 bytes)

Byte Expansion by null bit insertion (1 byte => 4 bytes)

| M1M0 | 1st Z1 / 2nd Z1 |
|------|-----------------|
| 00   | 0 / 0           |
| 01   | 0 / 1           |
| 10   | 1 / 0           |
| 11   | 1 / 1           |

DIGITAL TELEVISION TRANSMITTER/RECEIVER AND METHOD OF PROCESSING DATA IN DIGITAL TELEVISION TRANSMITTER/RECEIVER

This application claims the benefit of the Korean Patent Application No. 10-2005-0103548, filed on Oct. 31, 2005, which is hereby incorporated by reference as if fully set forth herein.

BACKGROUND OF THE INVENTION

1. Field of the Invention

The present invention relates to a digital telecommunications system, and more particularly, to a digital television (DTV) transmitter/receiver and a method of processing data in the DTV transmitter/receiver.

2. Discussion of the Related Art

Among a wide range of transmission modes, the 8T-VSB transmission mode, which is adopted as the standard for digital broadcasting in North America and the Republic of Korea, is a system that has been developed for the transmission of MPEG video/audio data. However, presently, the technology for processing digital signals is being developed at a vast rate, and, as a larger number of the population uses the Internet, digital electric appliances, computers, and the Internet are being integrated. Therefore, in order to meet with the various requirements of the users, a system that can add video/audio data through a digital television channel so as to transmit diverse supplemental information needs to be developed.

Some users may assume that supplemental data broadcasting would be applied by using a PC card or a portable device having a simple in-door antenna attached thereto. However, when used indoors, the intensity of the signals may decrease due to a blockage caused by the walls or disturbance caused by approaching or proximate mobile objects. Accordingly, the quality of the received digital signals may be deteriorated due to a ghost effect and noise caused by reflected waves. However, unlike the general video/audio data, when transmitting the supplemental data, the data that is to be transmitted should have a low error ratio. More specifically, in case of the video/audio data, errors that are not perceived or acknowledged through the eyes or ears of the user can be ignored, since they do not cause any or much trouble. Conversely, in case of the supplemental data (e.g., program execution file, stock information, etc.), an error even in a single bit may cause a serious problem. Therefore, a system highly resistant to ghost effects and noise is required to be developed.

The supplemental data are generally transmitted by a time-division method through the same channel as the MPEG video/audio data. However, with the advent of digital broadcasting, ATSC VSB digital television receivers that receive only MPEG video/audio data are already supplied to the market. Therefore, the supplemental data that are transmitted through the same channel as the MPEG video/audio data should not influence the conventional ATSC VSB receivers that are provided in the market. In other words, this may be defined as ATSC VSB compatibility, and the supplemental data broadcast system should be compatible with the ATSC VSB system. Herein, the supplemental data may also be referred to as enhanced data or EVSB data. Furthermore, in a poor channel environment, the receiving quality of the conventional ATSC VSB receiving system may be deteriorated. More specifically, resistance to changes in channels and noise is more highly required when using portable and/or mobile receivers.

SUMMARY OF THE INVENTION

Accordingly, the present invention is directed to a digital television (DTV) transmitter and a method of coding main and enhanced data in the DTV transmitter that substantially obviate one or more problems due to limitations and disadvantages of the related art.

An object of the present invention is to provide a digital television system that is suitable for transmitting supplemental data and that is highly resistant to noise.

Another object of the present invention is to provide a digital television (DTV) transmitter and a method of coding main and enhanced data in the DTV transmitter that can insert known data in a specific area of the supplemental data and transmitting the data to a DTV transmitter/receiver, thereby enhancing the receiving performance of the digital television system.

A further object of the present invention is to provide a device and method for efficiently processing symbols when transmitting/receiving enhanced data including the known data.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital television (DTV) transmitter for coding main and enhanced data includes a byte-symbol converter for converting main and enhanced data packets into symbols, at least one of the enhanced data packets including data place holders for known data symbols, a known data generator for generating a known data symbol, a symbol processor for processing a first symbol outputted from the byte-symbol converter, the symbol processor post-decoding a first bit of the known data symbol and outputting the post-decoded bit and an initialization data bit when the first symbol is a symbol representing one of the place holders, and a trellis encoder having one or more memories for trellis-encoding a second symbol outputted from the symbol processor, wherein the memories are initialized when the initialization data bit is processed in the trellis encoder.

In another aspect of the present invention, a digital television (DTV) transmitter for coding main and enhanced data includes a byte-symbol converter for converting main and enhanced data packets into symbols, at least one of the enhanced data packets including data place holders for known data symbols, a known data generator for generating a known data symbol, a symbol processor for processing a first symbol outputted from the byte-symbol converter, the symbol processor post-decoding an upper bit of the first symbol and outputting the post-decoded bit and an initialization data bit when the first symbol is an enhanced data symbol, and a trellis encoder having one or more memories for trellis-encoding a second symbol outputted from the symbol processor, wherein the memories are initialized when the initialization data bit is processed in the trellis encoder.

In another aspect of the present invention, a digital television (DTV) transmitter for coding main and enhanced data includes a byte-symbol converter for converting main and enhanced data packets into symbols, at least one of the enhanced data packets including data place holders for known data symbols, a known data generator for generating a known data symbol, a symbol processor for processing a first symbol outputted from the byte-symbol converter, and a trellis encoder having one or more memories for trellis-encoding a second symbol outputted from the symbol processor, wherein the symbol processor post-decodes a previous value of one of the memories and outputs the post-decoded value and a lower bit of the first symbol when the first symbol is an enhanced data symbol.

In another aspect of the present invention, a method of coding main and enhanced data in a digital television (DTV) transmitter includes converting main and enhanced data packets into symbols using a byte-symbol converter, at least one of the enhanced data packets including null data placed in specific data place holders, generating a known data symbol, post-decoding a first bit of the known data symbol and outputting the post-decoded bit and an initialization data bit when a first symbol outputted from the byte-symbol converter is a null data symbol, and initializing one or more memories included in a trellis encoder by inputting the post-decoded bit and the initialization data bit into the trellis encoder.

In another aspect of the present invention, a method of coding main and enhanced data in a digital television (DTV) transmitter includes converting main and enhanced data packets into symbols using a byte-symbol converter, at least one of the enhanced data packets including null data placed in specific data place holders, generating a known data sequence, post-decoding an upper bit of a first symbol outputted from the byte-symbol converter and outputting the post-decoded bit and an initialization data bit when the first symbol is an enhanced data symbol, and initializing one or more memories included in a trellis encoder by inputting the post-decoded bit and the initialization data bit into the trellis encoder.

In a further aspect of the present invention, a method of coding main and enhanced data in a digital television (DTV) transmitter includes converting main and enhanced data packets into symbols using a byte-symbol converter, at least one of the enhanced data packets including null data placed in specific data place holders, generating a known data sequence, post-decoding a previous value of one of memories included in a trellis encoder and outputting the post-decoded value and a lower bit of a first symbol outputted from the byte-symbol converter when the first symbol is an enhanced data symbol, and trellis-encoding the post-decoded value and the lower bit of the first symbol.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 11 illustrates an example of an input symbol for initializing a memory of the trellis encoder according to the present invention;

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

In the present invention, the enhanced data may either consist of data including information such as program execution files, stock information, and so on, or consist of video/audio data. Additionally, the known data refer to data already known based upon a pre-determined agreement between the transmitter and the receiver. Furthermore, the main data consist of data that can be received from the conventional receiving system, wherein the main data include video/audio data. The present invention relates to inserting known data known by the transmitter/receiver in a specific area of an enhanced data packet and transmitting the processed data packet, thereby enhancing the receiving performance of the receiving system. Most particularly, the present invention relates to multiplexing the enhanced data including the known data and the main data in packet units, thereby performing additional encoding of only the enhanced data when encoding the multiplexed data in a symbol area.

Figure 1:
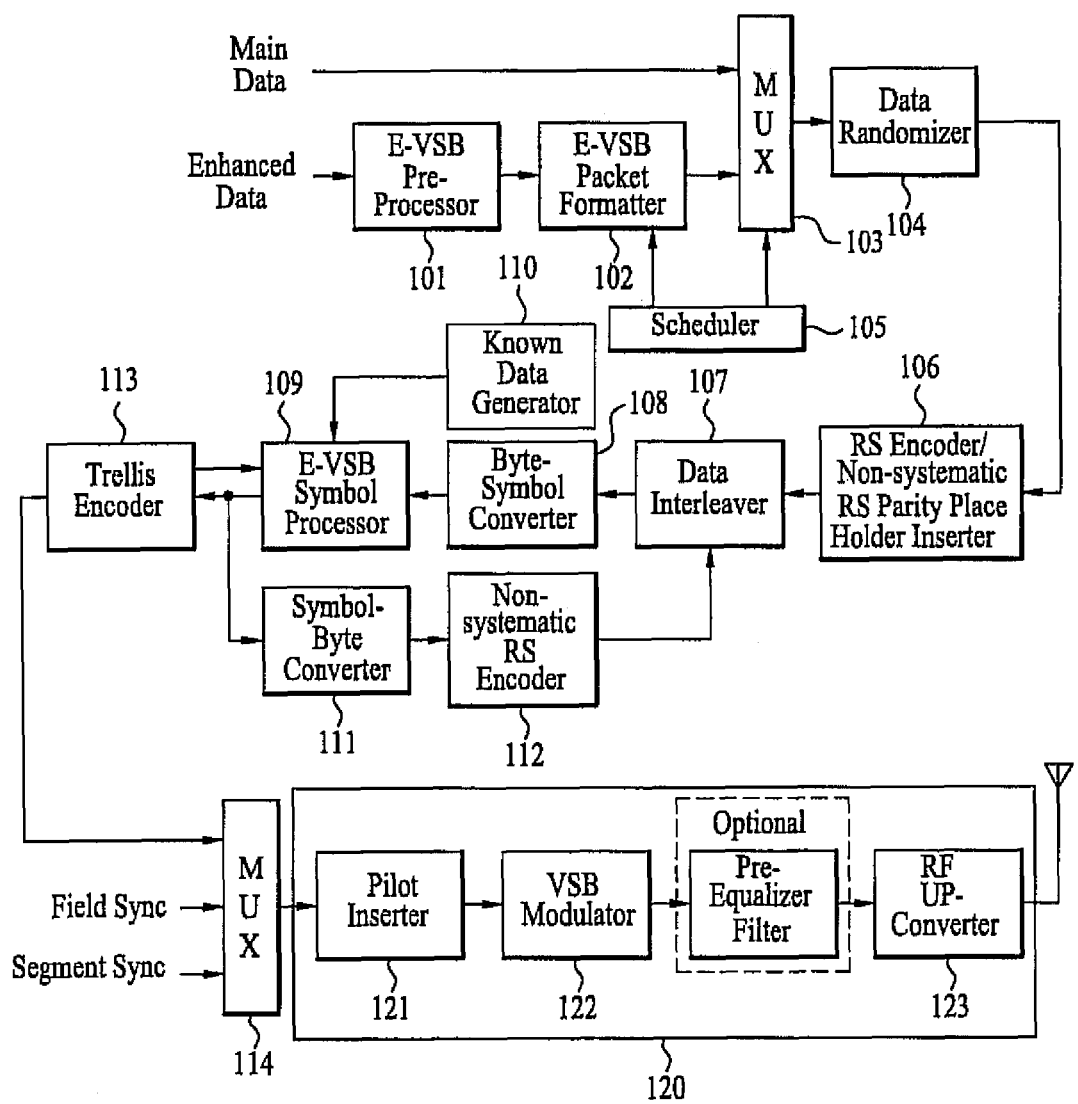
FIG. 1 illustrates a block view of a digital television receiver according to the present invention.

FIG. 1 illustrates a block view of a digital television receiver according to the present invention. The digital television receiver includes an E-VSB pre-processor 101, an E-VSB packet formatter 102, a packet multiplexer 103, a data randomizer 104, a scheduler 105, a Reed-Solomon (RS) encoder/parity place holder inserter 106, a data interleaver 107, a byte-symbol converter 108, an E-VSB symbol processor 109, a known data generator 110, a symbol-byte converter 111, a non-systematic RS encoder 112, a trellis encoder 113, a frame multiplexer 114, and a transmitter 120. In the present invention having the above-described structure, a main data packet is outputted to the packet multiplexer 103, and enhanced data are outputted to the E-VSB pre-processor 101. The E-VSB pre-processor 101 pre-processes the enhanced data, such as encoding additional error correction, interleaving, and inserting null data, and then outputs the pre-processed enhanced data to the E-VSB packet formatter 102.

Based upon the control of the scheduler 105, the E-VSB packet formatter 102 multiplexes the pre-processed enhanced data and the known data place holder having the null data inserted therein, thereby configuring a group. The data within the group are then divided into 184-byte unit enhanced data packets, and a 4-byte MPEG header is added to the beginning of the enhanced data packet, thereby outputting a 188-byte enhanced data packet (i.e., a MPEG compatibility packet). In other words, one enhanced data packet group includes a plurality of consecutive enhanced data packets. The output of the E-VSB packet formatter 102 is inputted to the packet multiplexer 103. The packet multiplexer 103 time-division multiplexes the main data packet and the enhanced data packet group in transport stream (TS) packet units and outputs the multiplexed TS packet in accordance with the control of the scheduler 105. More specifically, the scheduler 105 generates and outputs a control signal so that the packet multiplexer 103 can multiplex the main data packet and the enhanced data packet group. Accordingly, the packet multiplexer 103 receives the control signal, thereby multiplexing and outputting the main data packet and the enhanced data packet group to TS packet units.

The output data of the packet multiplexer 103 is inputted to the data randomizer 104. The data randomizer 104 discards (or deletes) the MPEG synchronization byte and randomizes the remaining 187 bytes by using a pseudo-random byte, which is generated from inside the data randomizer 104. Thereafter, the randomized data are outputted to the Reed-Solomon (RS) encoder/parity place holder inserter 106. The RS encoder/parity place holder inserter 106 processes the randomized data with either a systematic RS-coding process or a non-systematic parity place holder insertion process. More specifically, when the 187-byte packet that is outputted from the data randomizer 104 corresponds to the main data packet, RS encoder/parity place holder inserter 106 performs the same systematic RS-coding as the conventional ATSC VSB system, thereby adding a 20-byte parity byte at the end of the 187-byte data.

Conversely, when the 187-byte packet that is outputted from the data randomizer 104 corresponds to the enhanced data packet, a position (or place) of a parity byte within the packet is decided so that the 20 parity bytes are outputted from the output terminal of the data interleaver 107 later than the 187 data bytes. Then, a null byte is inserted in the decided parity byte position (or place). Further, the 187 data bytes received from the data randomizer 104 are sequentially inserted in the remaining 187 byte positions. Herein, the null byte may be given an arbitrary value, and such null byte value may be substituted with the parity value calculated by the non-systematic RS encoder 112 in a later process.

Accordingly, the role of the null byte is to ensure the parity byte position (or place) of a non-systematic RS code. The non-systematic RS code is used for the enhanced data packet for the following reason. When the value of the enhanced data is changed by the E-VSB symbol processor 109, which will be described in detail in a later process, the RS parity should be recalculated. And so, the parity bytes should be outputted from the data interleaver 107 output terminal later than the data bytes. For example, when K number of data bytes are received and P number of parity bytes are added thereto so as to be RS-coded, P number of arbitrary bytes among the total N(=K+P) number of bytes may be used as the parity bytes. Herein, the parity place holder may vary in each segment.

The output data of the RS encoder/parity place holder inserter 106 are outputted to the data interleaver 107. Then, the data interleaver 107 interleaves and outputs the received data. At this point, the data interleaver 107 receives a RS parity byte that is newly calculated and outputted by the non-systematic RS encoder 112 and, then, substitutes the newly received RS parity byte for the non-systematic RS parity place holder which is not yet outputted. More specifically, the data interleaved 187 information bytes are first outputted. Thereafter, the 20 parity place holders in which a null byte is respectively inserted are replaced with the newly calculated 20 RS parity bytes and then outputted.

Each byte outputted from the data interleaver 107 is converted into 4 symbols by the byte-symbol converter 108, which are then outputted to the E-VSB symbol processor 109. Herein, one symbol consists of 2 bits. Additionally, the known data generated (or created) from the known data generator 110 are also outputted to the E-VSB symbol processor 109. Herein, the known data consist of the known data symbol generated from the symbol domain. This is because the known data are used in the symbol domain of the receiver. And, accordingly, it is more efficient to create a known data symbol sequence having the desired characteristics in the symbol domain.

The E-VSB symbol processor 109 receives the data outputted from the byte-symbol converter 108 and the known data symbol generated from the known data generator 110, processes the received data with a plurality of processing steps, and then outputs the processed data to the trellis encoder 113 and the symbol-byte converter 111, respectively. More specifically, in case of a main data symbol, the E-VSB symbol processor 109 outputs the received symbol without any change in data. On the other hand, in case of an enhanced data symbol, the received symbol is processed with a signal process that can provide additional coding gain when used in connection with the trellis encoder 113. At this point, when the data that are outputted from the byte-symbol converter 108 correspond to a known data place holder in which null data are inserted, the output data are replaced with the known data generated from the data generator 110, which are then outputted to the trellis encoder 113 and the symbol-byte converter 111.

In the portion where the known data symbol begins, the E-VSB symbol processor 109 generates a data symbol that initializes a memory of the trellis encoder 113 to a predetermined state. Thereafter, the E-VSB symbol processor 109 outputs the generated data symbol instead of the known data symbol having received the data symbol. In order to do so, the value of the memory in the trellis encoder 113 should be provided to the E-VSB symbol processor 109. The trellis encoder 113 is initialized at the beginning of the known data sequence because, even though the known data sequence is inputted as the input of the trellis encoder 113, a plurality of output sequences may be outputted depending upon the memory state of the trellis encoder 113. Therefore, when the known data are inputted after the memory state of the trellis encoder 113 is initialized to a predetermined value, the known data output sequence may also be obtained from the output of the trellis encoder 113.

The trellis encoder 113 pre-codes the data that are inputted as the upper bit among the output symbols of the E-VSB symbol processor 208, and trellis-encodes the data that are inputted as the lower bit. Thereafter, the pre-coded data and the trellis-encoded data are outputted to the frame multiplexer 114. Meanwhile, the E-VSB symbol processor 109 receives the symbol consisting of 2 bits, processes the received symbol with a plurality of process steps, and outputs the processed symbol. Therefore, the symbol should be converted back to bytes from the symbol-byte converter 111 so that the non-systematic RS encoder 112 can recalculate the RS parity from the output of the E-VSB symbol processor 109. In other words, the input symbol is converted to byte units from the symbol-byte converter 111 and outputted to the non-systematic RS encoder 112. The non-systematic RS encoder 112 calculates the 20-byte RS parity for the data packet configured of 187 information bytes and outputs the calculated RS parity to the data interleaver 107. The data interleaver 107 receives the RS parity byte calculated and outputted from the non-systematic RS encoder 112 and replaces the non-systematic place holder that is not yet outputted with the received RS parity byte.

The frame multiplexer 114 inserts 4 segment synchronization symbols in each 828 output symbols of the trellis encoder 113, thereby configuring a data segment having 832 data symbols. More specifically, one field synchronization segment is inserted in each 312 data segments, so as to configure one data field, which is then outputted to the transmitter 120. The transmitter 120 inserts a pilot signal in the output of the frame multiplexer 114, the output having a segment synchronization signal and a field synchronization signal inserted therein. The transmitter 120 then VSB modulates the pilot signal inserted data and converts the VSB modulated data to an RF signal, which is transmitted through the antenna. Accordingly, the transmitter 120 includes a pilot inserter 121, a VSB modulator 122, and a RF-UP converter 123. Furthermore, a pre-equalizer filter may be optionally included.

In the present invention, the E-VSB symbol processor 109 and the trellis encoder 113 will be described in more detail. Referring to FIG. 1, in order to simplify the distinction of each symbol, M represents the main data symbol, E signifies the enhanced data symbol, and T represents the known data symbol. More specifically, the E-VSB symbol processor 109 receives the data outputted from the byte-symbol converter 108 and the known data symbol generated from the known data generator 110. Then, after processing the received data and known data symbol with a plurality of process steps, the E-VSB symbol processor 109 outputs the processed data and known data symbol to the trellis encoder 113 and the symbol-byte converter 111.

In other words, the E-VSB symbol processor 109 convolution-codes only the enhanced data symbol E with a coding rate of ½ (hereinafter referred to as a ½-coding rate) and does not convolution-codes the main data symbol M nor the known data symbol T with a coding rate of ½. In addition, the E-VSB symbol processor 109 also bypasses the MPEG header byte added by the E-VSB packet formatter and the RS parity of the enhanced data packet added by the RS encoder without performing any encoding. At this point, if the data outputted from the byte-symbol converter 10B consist of the known data place holder having the null data inserted therein, the output data are replaced with the known data symbol generated from the known data generator 110 and then outputted to the trellis encoder 113 and the symbol-byte converter 111.

In the portion where the known data symbol begins, the E-VSB symbol processor 109 generates a data symbol that initializes a memory of the trellis encoder 113 to a predetermined state. Thereafter, the E-VSB symbol processor 109 outputs the generated data symbol. In order to do so, the value of the memory in the trellis encoder 113 should be received from the E-VSB symbol processor 109. The trellis encoder 113 is initialized at the beginning of the known data sequence because, even though the known data sequence is inputted as the input of the trellis encoder 113, a plurality of output sequences may be outputted depending upon the memory state of the trellis encoder 113. Therefore, when the known data are inputted after the memory state of the trellis encoder 113 is initialized to a predetermined value, the known data output sequence may also be obtained from the output of the trellis encoder 113. Herein, 2 symbols are required for initializing the memory of the trellis encoder 113. Since the VSB transmitting system includes 12 trellis encoders, 24 input symbols are used for the initializing process. In other words, since the ATSC VSB system uses 12 identical trellis encoders, the E-VSB symbol processor 109 should be also provided with 12 identical symbol processors.

Figures 2A, 2B:
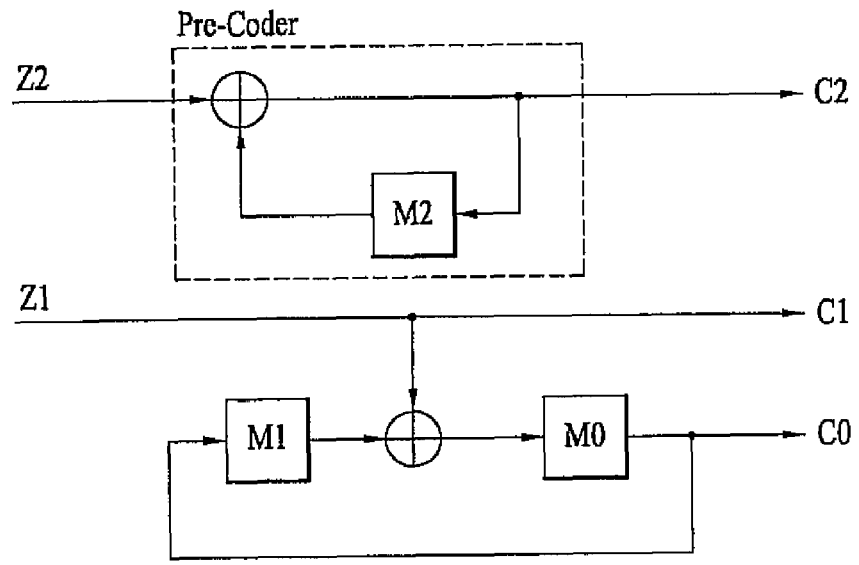
FIG. 2A and FIG. 2B each illustrates an example of a trellis encoder and mapping, respectively.

FIG. 2A illustrates an example of the trellis encoder 113, wherein two input bits Z1 and Z2 are encoded to be outputted as three bits C0, C1, and C2. The upper bit Z2 of the input symbol is pre-coded by the pre-coder so as to be outputted as C2. The lower bit Z1 of the input symbol is trellis-encoded and outputted as C1 and C0. The output C2C1C0 of the trellis encoder 113 is mapped as an 8-level VSB signal, as shown in FIG. 2B, and then outputted. In other words, the trellis encoder 113 pre-codes the upper bit Z1 of the output symbol of the E-VSB symbol processor 109 and outputs the pre-coded upper bit Z2 as C2. Alternatively, the trellis encoder 113 trellis-encodes the lower bit Z1 and outputs the trellis-encoded lower bit Z1 as C1 and C0.

Figure 3A:
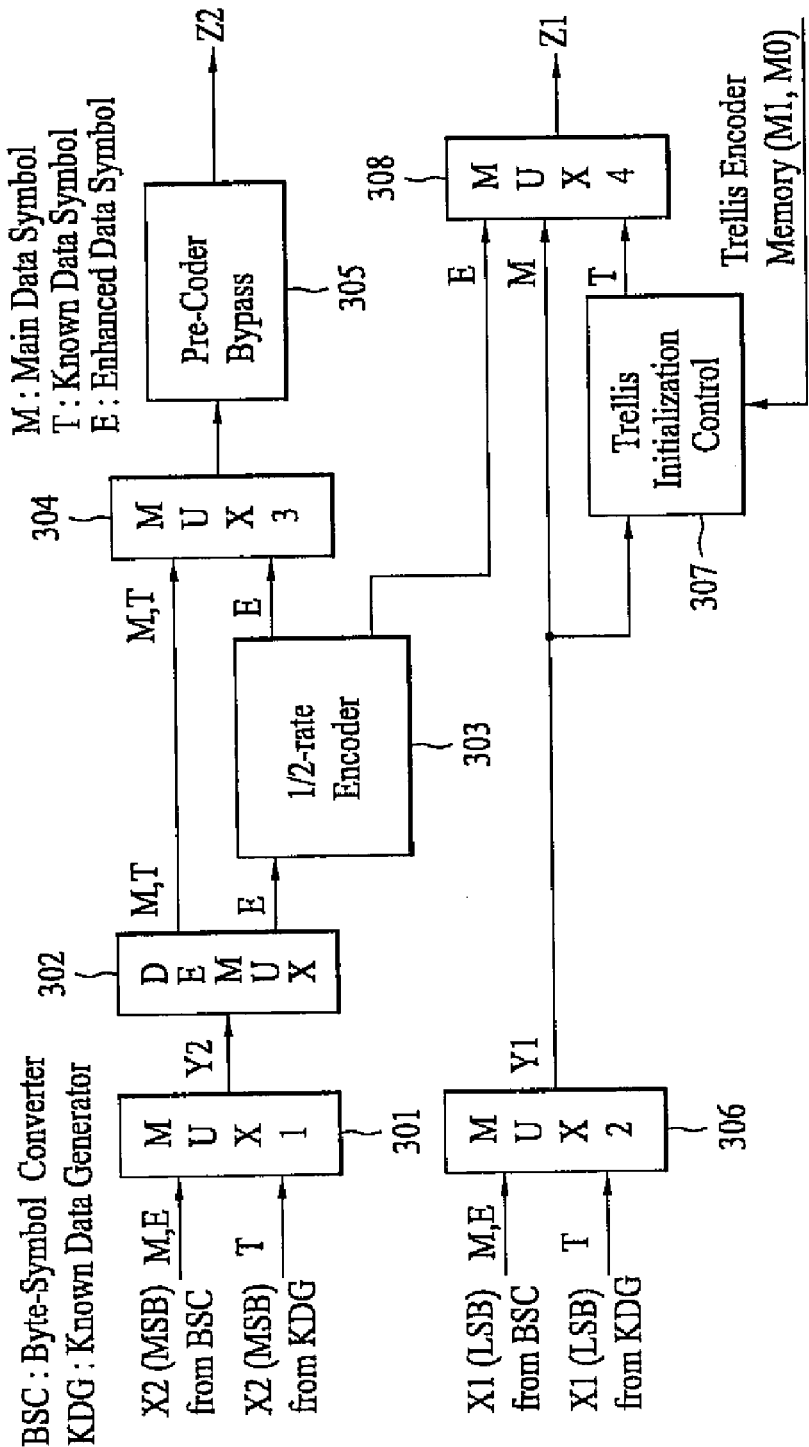
FIG. 3A illustrates a block view of an E-VSB symbol processor according to an embodiment of the present invention.
Figure 3B:
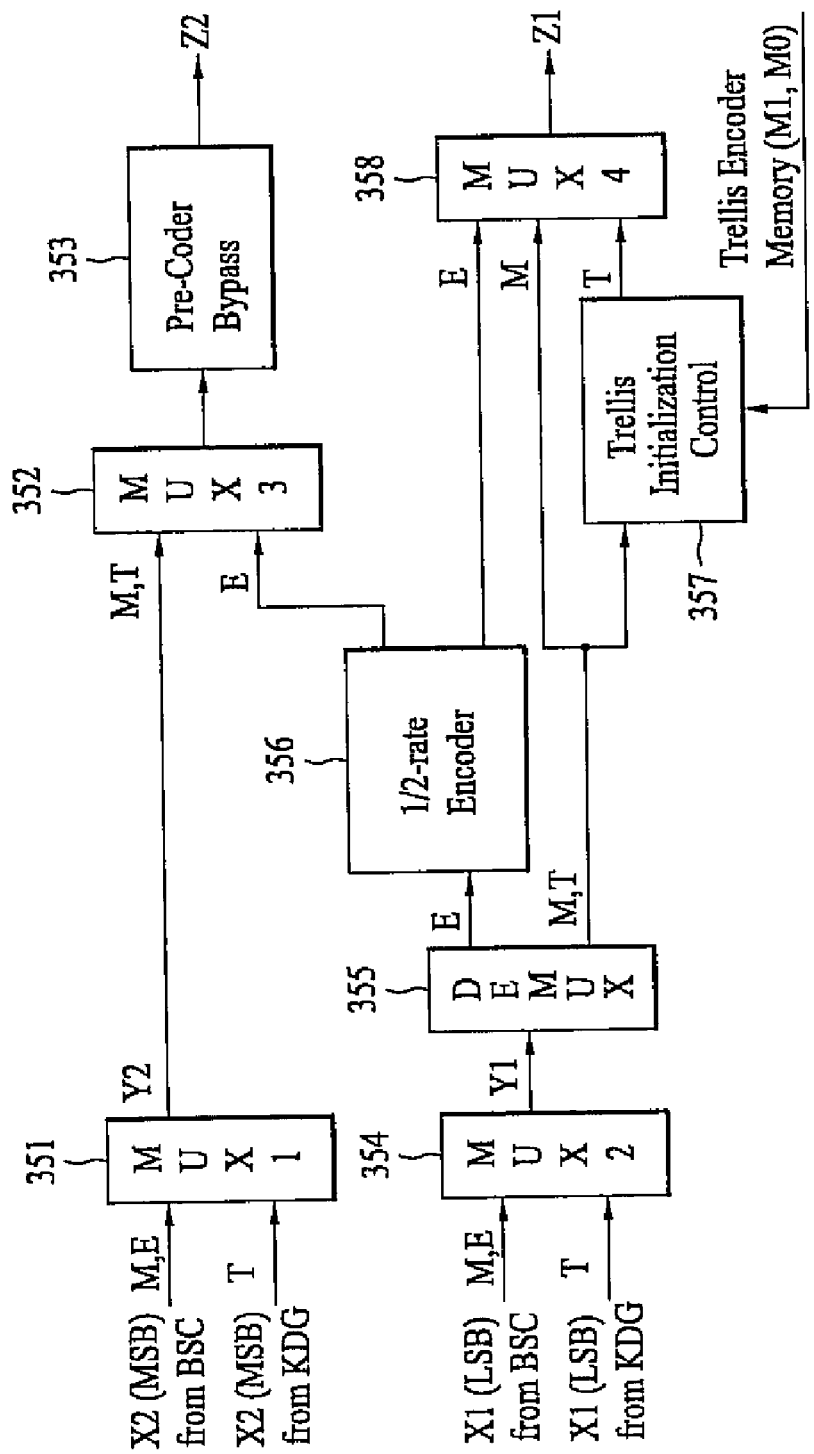
FIG. 3B illustrates a block view of an E-VSB symbol processor according to another embodiment of the present invention.

FIG. 3A illustrates a block view of an E-VSB symbol processor according to an embodiment of the present invention. And, FIG. 3B illustrates a block view of an E-VSB symbol processor according to another embodiment of the present invention. Referring to FIGS. 3A and 3B, X2 corresponds to the upper bit among the 2 bits of the input symbol, and X1 corresponds to the lower bit. M represents the main data symbol, T signifies the known data symbol, and E represents the enhanced data symbol. At this point, if the MPEG header byte inserted to the enhanced data packet and the parity byte inserted by the RS encoder are converted to symbols, the inserted bytes are processed as the main data symbol.

The E-VSB symbol processor of FIG. 3A includes first to fourth multiplexers 301, 306, 304, and 308, a demultiplexer 302, a ½-coding rate encoder (hereinafter referred to as a "½-rate encoder") 303, a pre-coder bypass 305, and a trellis initialization controller 307. Referring to FIG. 3A, when the input symbol is one of a main data symbol M and an enhanced data symbol E, the first multiplexer 301 selects an upper bit X2 of a symbol outputted from the byte-symbol converter 108. Alternatively, when the input symbol is a known data (or known data place holder) symbol T, the first multiplexer 301 selects an upper bit X2 of a symbol outputted from the known data generator 110. Thereafter, the first multiplexer 301 outputs the selected upper bit X2 to the demultiplexer 302.

Additionally, when the input symbol is one of a main data symbol M and an enhanced data symbol E, the second multiplexer 306 selects a lower bit X1 of the symbol outputted from the byte-symbol converter 108. And, when the input symbol is a known data symbol T, the second multiplexer 306 selects a lower bit X1 of the symbol outputted from the known data generator 110. Thereafter, the second multiplexer 306 outputs the selected lower bit X1 to the fourth multiplexer 308 and the trellis initialization controller 307. When the output bit Y2 outputted from the first multiplexer 301 is one of the upper bit of the main data symbol and the upper bit of the known data symbol, the demultiplexer 302 outputs the output bit Y2 to the third multiplexer 304. Alternatively, when the output bit Y2 is the upper bit of the enhanced data symbol, the demultiplexer 302 outputs the output bit Y2 to the ½-coding rate encoder (hereinafter referred to as "½-rate encoder") 303.

The ½-rate encoder 303 operates only on the enhanced data symbol, thereby coding the Y2 bit of the enhanced data symbol and outputting two bits. At this point, among the output bits, one is outputted to the pre-coder bypass 305 through the third multiplexer 304, and the other is outputted to the fourth multiplexer 308. When the input symbol is one of the main data symbol M and the known data symbol T, the third multiplexer 304 selects the output of the demultiplexer 302. And, when the input symbol is the enhanced data symbol E, the third multiplexer 304 selects one output bit of the ½-rate encoder 303 and outputs the selected bit to the pre-coder bypass 305. When the input data are one of the enhanced data symbol and the known data symbol, the pre-coder bypass 305 operates (or calculates) the input data, so that the pre-coder is bypassed in the trellis encoder 113 in a later process. Then the pre-coder bypass 305 outputs the operated (or calculated) data. When the input data correspond to the main data symbol, the data are outputted without any change. The operation of the pre-coder bypass 305 will be described in detail in a later process.

When the input symbol is the enhanced data symbol, the fourth multiplexer 308 selects the output bit of the ½-rate encoder 303 instead of the input bit Y1 and outputs the selected output bit. When the input symbol is the main data symbol, the fourth multiplexer 308 selects the output bit Y1 of the second multiplexer 306 and outputs the selected output bit Y1. Meanwhile, when the input symbol is the known data symbol, the fourth multiplexer 308 selects and outputs the output of the trellis initialization controller 307.

The trellis initialization controller 307 generates data that enable the memory of the trellis encoder 113 to be initialized to a predetermined state, when the sequence of the known data symbol begins. Then, the trellis initialization controller 307 outputs the generated data instead of the known data outputted from the second multiplexer 306. Thereafter, the remaining portion of the known data outputted from the second multiplexer 306 is bypassed to the fourth multiplexer 308. The operation of the trellis initialization controller 307 will be described in detail in a later process. As a result, the E-VSB symbol processor of FIG. 3A encodes the upper bit X2 among the two input bits of the enhanced data symbol and, then, outputs two bits. Herein, the lower bit X1 is discarded (or deleted).

FIG. 3B illustrates a block view of an E-VSB symbol processor according to another embodiment of the present invention. Herein, FIG. 3A and FIG. 3B are very similar to one another. However, the difference between the two E-VSB symbol processors is that, in the one shown in FIG. 3B, the lower bit X1 among the two input bits of the enhanced data symbol is encoded, thereby outputting two bits, whereas the upper bit X2 is discarded (or deleted).

Referring to FIG. 3B, when the input symbol is one of a main data symbol M and an enhanced data symbol E, the first multiplexer 351 selects an upper bit X2 of a symbol outputted from the byte-symbol converter 108. Alternatively, when the input symbol is a known data (or known data place holder) symbol T, the first multiplexer 351 selects an upper bit X2 of a symbol outputted from the known data generator 110. Thereafter, the first multiplexer 351 outputs the selected upper bit X2 to the third multiplexer 352.

Additionally, when the input symbol is one of a main data symbol M and an enhanced data symbol E, the second multiplexer 354 selects a lower bit X1 of the symbol outputted from the byte-symbol converter 108. And, when the input symbol is a known data symbol T, the second multiplexer 354 selects a lower bit X1 of the symbol outputted from the known data generator 110. Thereafter, the second multiplexer 354 outputs the selected lower bit X1 to the demultiplexer 355. When the output bit Y1 outputted from the second multiplexer 354 is the enhanced data, the demultiplexer 355 outputs the output bit Y1 to the ½-rate encoder 356. Alternatively, when the output bit Y1 is the main data, the demultiplexer 355 outputs the output bit Y1 to the fourth multiplexer 358. Finally, when the output bit Y1 is the known data, the demultiplexer 355 outputs the output bit Y1 to the trellis initialization controller 357.

The ½-rate encoder 356 performs ½-rate coding on the enhanced data bit outputted from the demultiplexer 355, thereby generating 2 bits. Herein, one of the 2 bits is outputted to the third multiplexer 352, and the other bit is outputted to the fourth multiplexer 358. When the input data is one of the main data and the known data, the third multiplexer 352 selects the output bit Y2 of the first multiplexer 351. And, when the input data is the enhanced data, the third multiplexer 352 selects the output bit of the ½-rate encoder 356. Then, the third multiplexer 352 outputs the selected bit to the pre-coder bypass 353. When the input data are one of the enhanced data and the known data, the pre-coder bypass 353 operates (or calculates) the input data, so that the pre-coder is bypassed in the trellis encoder 113 in a later process. Then, the pre-coder bypass 353 outputs the operated (or calculated) data. When the input data correspond to the main data, the data are outputted without any change. When the input symbol is the enhanced data symbol, the fourth multiplexer 358 selects and outputs the other output bit of the ½-rate encoder 356. When the input symbol is the main data symbol, the fourth multiplexer 358 selects and outputs the output bit of the demultiplexer 355.

Meanwhile, when the input symbol is the known data symbol, the fourth multiplexer 358 selects and outputs the output of the trellis initialization controller 357. The trellis initialization controller 357 generates data that enable the memory of the trellis encoder 113 to be initialized to a predetermined state, when the sequence of the known data symbol begins. Then, the trellis initialization controller 357 outputs the generated data instead of the known data outputted from the demultiplexer 355. Thereafter, the remaining portion of the known data outputted from the demultiplexer 355 is bypassed to the fourth multiplexer 358. As a result, the E-VSB symbol processor of FIG. 3B encodes only the lower bit X1 among the two input bits of the enhanced data symbol and, then, outputs two bits. Herein, the upper bit X2 is discarded (or deleted).

Figure 4A:
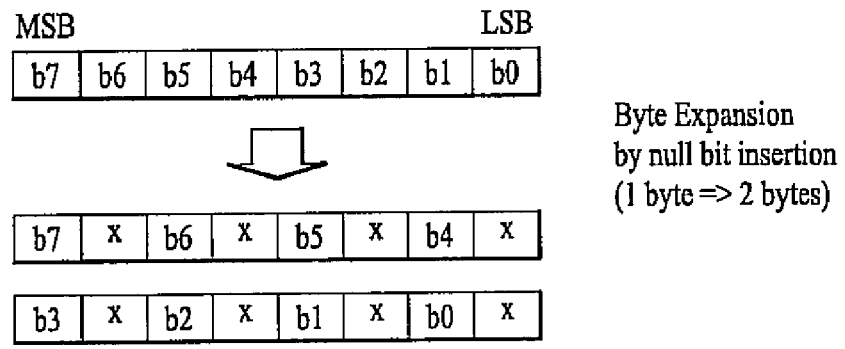
FIG. 4A to FIG. 4C illustrate examples of expanding one enhanced data byte to two bytes according to the present invention.
Figure 4B:
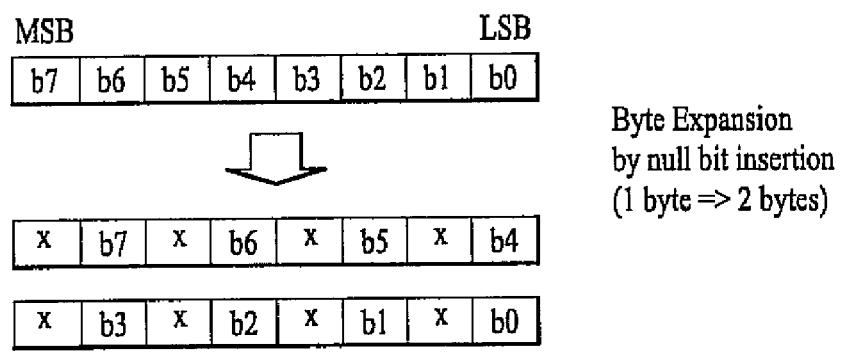
Figure 4C:
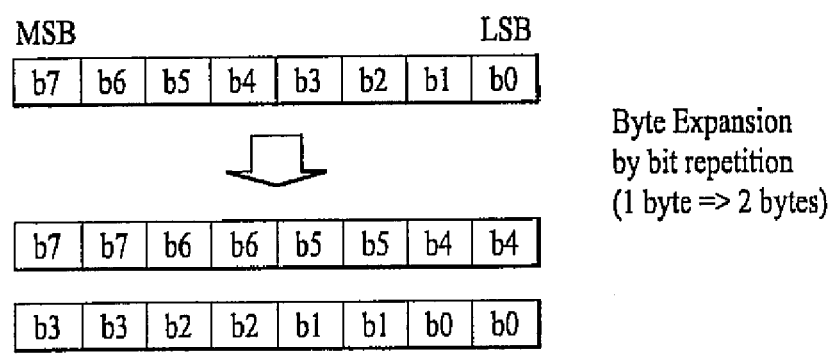
Figure 5A:
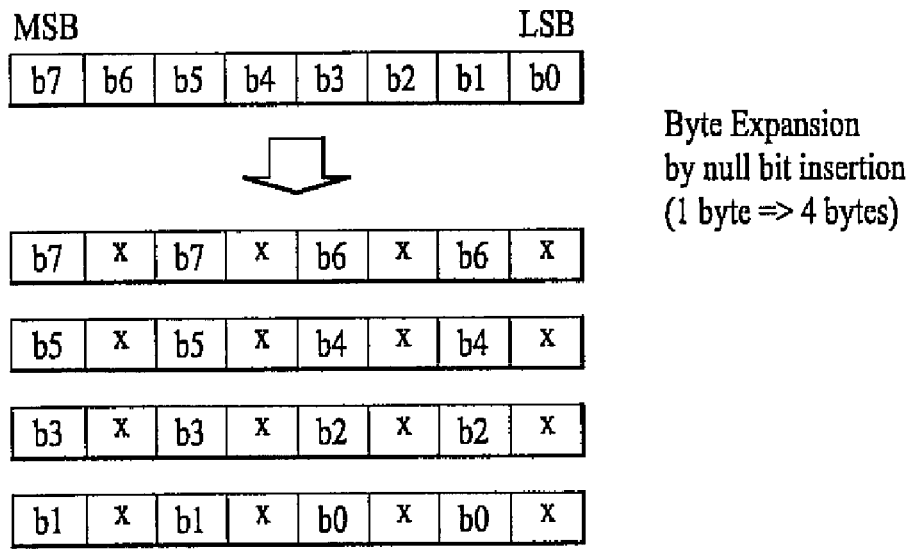
FIG. 5A to FIG. 5C illustrate examples of expanding one enhanced data byte to four bytes according to the present invention.
Figure 5B:
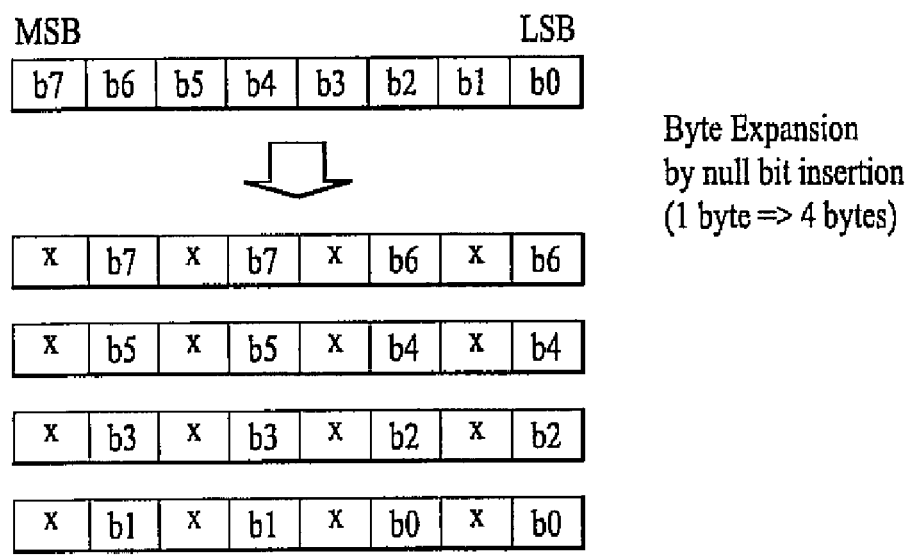
Figure 5C:
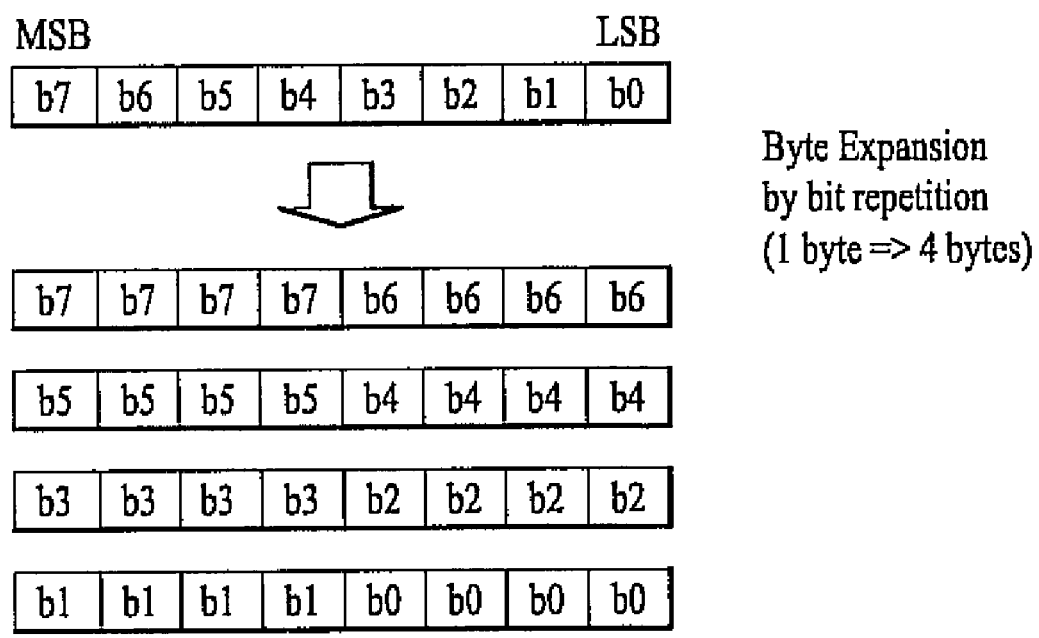

Meanwhile, the E-VSB pre-processor 101 of FIG. 1 performs pre-processing steps such as additional error correction encoding, byte expansion, and so on, on the enhanced data. At this point, the processing method of the E-VSB symbol processor may vary in accordance with the byte expansion method of the E-VSB pre-processor 101. Examples of the same are shown in FIG. 4A to FIG. 4C and also in FIG. 5A to FIG. 5C. Herein, FIG. 4A to FIG. 4C illustrate examples of expanding one enhanced data byte to two bytes according to the present invention. And, FIG. 5A to FIG. 5C illustrate examples of expanding one enhanced data byte to four bytes according to the present invention. FIG. 4A and FIG. 5A are most effective when applied to the E-VSB symbol processor of FIG. 3A. Alternatively, FIG. 4B and FIG. 5B are most effective when applied to the E-VSB symbol processor of FIG. 3B. FIG. 4C and FIG. 5C may be applied in any one of FIG. 3A and FIG. 3B. The byte expansion includes the method of inserting null data bits between each bit and the method of repeating each bit.

FIG. 4A illustrates an example of the E-VSB pre-processor 101 expanding one enhanced data byte to two bytes when using the E-VSB symbol processor shown in FIG. 3A. In the E-VSB symbol processor of FIG. 3A, only the upper bit of the enhanced data symbol is used and the lower bit is discarded (or deleted). Therefore, as shown in FIG. 4A, the E-VSB pre-processor 101 inserts a null data bit x after each bit for one input byte, thereby outputting two bytes. In a later process, the outputted bytes are converted to a 2-bit unit symbol by the byte-symbol converter and inputted to the E-VSB symbol processor of FIG. 3A. At this point, the upper bit X2 of the input symbol includes information, and the lower bit X1 is a null data bit. Herein, the lower bit X1 is replaced with the output bit of the ½-rate encoder 303 by the fourth multiplexer 30B of FIG. 3A.

FIG. 4B illustrates an example of the E-VSB pre-processor 101 expanding one enhanced data byte to two bytes when using the E-VSB symbol processor shown in FIG. 3B. In the E-VSB symbol processor of FIG. 3B, only the lower bit of the enhanced data symbol is used and the upper bit is discarded (or deleted). Therefore, as shown in FIG. 4B, the E-VSB pre-processor 101 inserts a null data bit x before each bit for one input byte, thereby outputting two bytes. In a later process, the outputted bytes are converted to a 2-bit unit symbol by the byte-symbol converter and inputted to the E-VSB symbol processor of FIG. 3B. At this point, the upper bit X2 is a null data bit, and the lower bit X1 of the input symbol includes information. Herein, the upper bit X2 is replaced with the output bit of the ½-rate encoder 356 by the third multiplexer 352 of FIG. 3B.

FIG. 4C illustrates yet another example of expanding one enhanced data byte to two bytes that can be applied to the E-VSB symbol processor of both FIG. 3A and FIG. 3B. The null data bit shown in FIG. 4A and FIG. 4B may be given an arbitrary value. Therefore, as shown in FIG. 4C, each bit for one input byte is repeated one time to be expanded to 2 bytes. This expansion method can be applied to the E-VSB symbol processor of both FIG. 3A and FIG. 3B.

FIG. 5A illustrates an example of the E-VSB pre-processor 101 expanding one enhanced data byte to four bytes when using the E-VSB symbol processor shown in FIG. 3A. In the E-VSB symbol processor of FIG. 3A, only the upper bit of the enhanced data symbol is used and the lower bit is discarded (or deleted). Therefore, as shown in FIG. 5A, the E-VSB pre-processor 101 repeats each bit for one input byte so as to create 2 bits. Then, the E-VSB pre-processor 101 inserts a null data bit x after each bit including the repeated bits, thereby outputting four bytes. More specifically, the amount of data in the enhanced data is expanded to 4 times its initial size. The outputted bytes are converted to a 2-bit unit symbol by the byte-symbol converter and inputted to the E-VSB symbol processor of FIG. 3A. At this point, the upper bit X2 of the input symbol includes information, and the lower bit X1 is a null data bit. Herein, the lower bit X1 is replaced with the output bit of the ½-rate encoder 303 by the fourth multiplexer 308 of FIG. 3A.

FIG. 5B illustrates an example of the E-VSB pre-processor 101 expanding one enhanced data byte to four bytes when using the E-VSB symbol processor shown in FIG. 3B. In the E-VSB symbol processor of FIG. 3B, only the lower bit of the enhanced data symbol is used and the upper bit is discarded (or deleted). Therefore, as shown in FIG. 5B, the E-VSB pre-processor 101 repeats each bit for one input byte so as to create 2 bits. Then, the E-VSB pre-processor 101 inserts a null data bit x before each bit including the repeated bits, thereby outputting four bytes. The outputted bytes are converted to a 2-bit unit symbol by the byte-symbol converter and inputted to the E-VSB symbol processor of FIG. 3B. At this point, the lower bit X1 of the input symbol includes information, and the upper bit X2 is a null data bit. Herein, the upper bit X2 is replaced with the output bit of the ½-rate encoder 356 by the third multiplexer 352 of FIG. 3B.

FIG. 5C illustrates yet another example of expanding one enhanced data byte to four bytes that can be applied to the E-VSB symbol processor of both FIG. 3A and FIG. 3B. The null data bit shown in FIG. 5A and FIG. 5B may be given an arbitrary value. Therefore, as shown in FIG. 5C, each bit for one input byte is repeated four times to be expanded to 4 bytes. This expansion method can be applied to the E-VSB symbol processor of both FIG. 3A and FIG. 3B. By expanding the data byte as shown in FIG. 5A to FIG. 5C, each bit is coded with a ½-coding rate twice by the E-VSB symbol processor, which results in a coding rate of ¼ (hereinafter referred to as a ¼-coding rate) of the bits.

Hereinafter, FIG. 6 to FIG. 9 illustrate detailed embodiments of the ½-rate encoder of the E-VSB symbol processor according to the present invention. FIG. 6A to FIG. 6C illustrate different examples of a ½-rate systematic convolutional encoder according to the present invention. More specifically, FIG. 6A illustrates a feedback type ½-rate systematic convolutional encoder having M number of memories. As shown in FIG. 6A, an input bit u is outputted directly as output bit d2 without being changed. In other words, the input bit u including information is outputted directly as output upper bit d2 and is simultaneously encoded, thereby being outputted as output lower bit d1. As described above, a convolutional encoder having the input bit directly outputted as one of the output bits is referred to as a "systematic convolutional encoder".

Figure 6A:
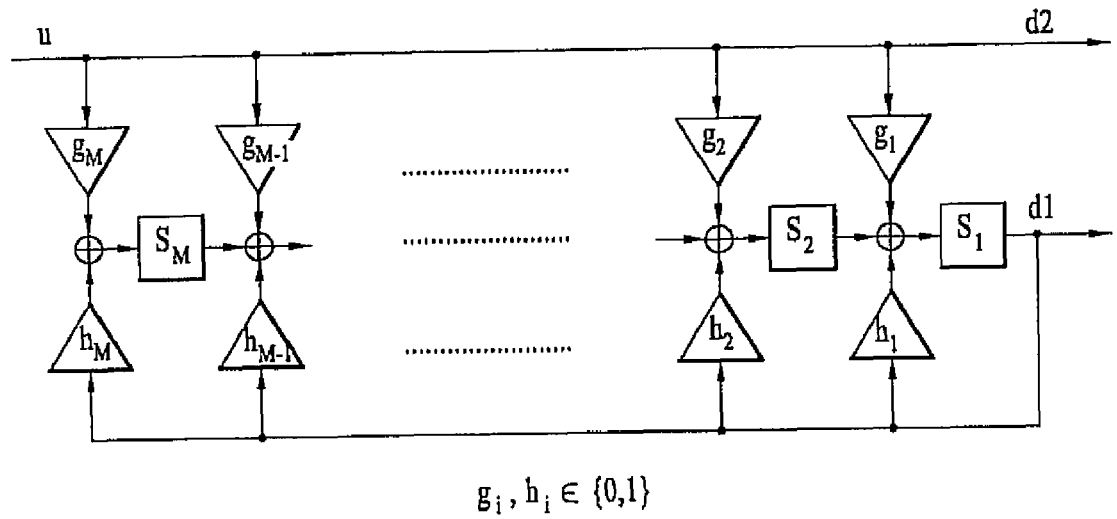
FIG. 6A to FIG. 6C illustrate block views of a systematic convolutional encoder according to an embodiment of the present invention.

The ½-rate systematic convolutional encoder of FIG. 6A is configured of M number of structures each including a multiplier $h_1$, another multiplier $g_1$, a modulo adder, and a memory $S_1$. The multiplier $h_1$ receives a fed-back value of the output lower bit d1 (i.e., a fed-back value of a memory $S_1$ of the final end) and multiplies the fed-back value by a predetermined value. The other multiplier $g_1$ receives the input bit u and multiplies the received input bit u by a predetermined value. The modulo adder adds the output of the two multipliers $h_1$ and $g_1$ and the output of a register in a previous end. The memory $S_1$ temporarily stores the output of the modulo adder. Herein, each of the M number of the above-described structure is provided in series, and an input bit u is outputted as two output bits d2 and d1. Also, the predetermined values multiplied in each multiplier (i.e., the coefficients $g_i$ and $h_i$) is equal to '0' or '1', wherein i=1, 2, 3, . . . , M. The input of each memory starting from $S_1$ to $S_{M-1}$ may be provided by having the input bit u and the output of the memory $S_1$ pass through each multiplier, respectively, which are then modulo added with the value of a previous (left) memory. Meanwhile, in case of the memory $S_M$, the input bit u and the output of the memory $S_1$ respectively pass through each multiplier $g_M$ and $h_M$, which are then inputted after being modulo added. The characteristic of the convolutional encoder of FIG. 6A is that the value of the very last memory $S_1$ is directly outputted as the lower bit d1. Simultaneously, this value may be fed-back as the input of the remaining memories.

Figure 6B:
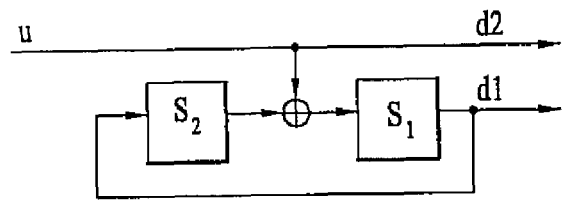
Figure 6C:
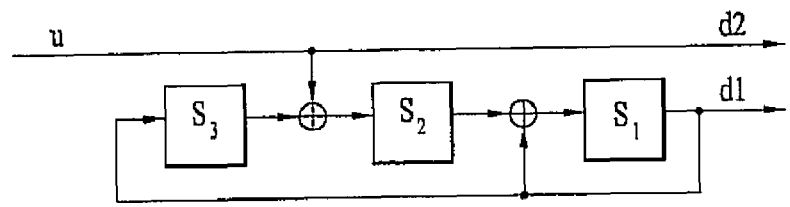

FIG. 6B illustrates an example of the ½-rate systematic convolutional encoder of FIG. 6A having two memories. And, FIG. 6C illustrates an example of the ½-rate systematic convolutional encoder of FIG. 6A having three memories. More specifically, FIG. 6B illustrates a block view of the ½-rate systematic convolutional encoder having two memories, which includes a memory $S_2$, an adder, and a memory $S_1$. The memory $S_2$ receives and temporarily stores the fed-back lower bit d1, which is convolution-coded. The adder adds the output of the memory $S_2$ and the input bit u. And, the memory $S_1$ temporarily stores the output of the adder and outputs the temporarily stored output as the lower bit d1, which is convolution-coded. More specifically, FIG. 6B is equivalent to when only the coefficients of the multipliers $g_1$ and $h_2$ of FIG. 6A are equal to '1', and when the coefficients of the remaining multipliers are equal to '0'.

FIG. 6C illustrates a block view of the ½-rate systematic convolutional encoder having three memories, which includes a memory $S_3$, a first adder, a memory $S_2$, a second adder, and a memory $S_1$. Herein, the memory $S_3$ receives and temporarily stores the fed-back lower bit d1, which is convolution-coded. The first adder adds the output of the memory $S_3$ and the input bit u. The memory $S_2$ temporarily stores the output of the first adder. The second adder adds the output of the memory $S_2$ and the fed-back lower bit d1, which is convolution-coded. The memory $S_1$ temporarily stores the output of the second adder and outputs the temporarily stored output as the lower bit d1, which is convolution-coded. More specifically, FIG. 6C is equivalent to when only the coefficients of the multipliers $g_2$, $h_1$, and $h_3$ of FIG. 6A are equal to '1', and when the coefficients of the remaining multipliers are equal to '0'.

Figure 7A:
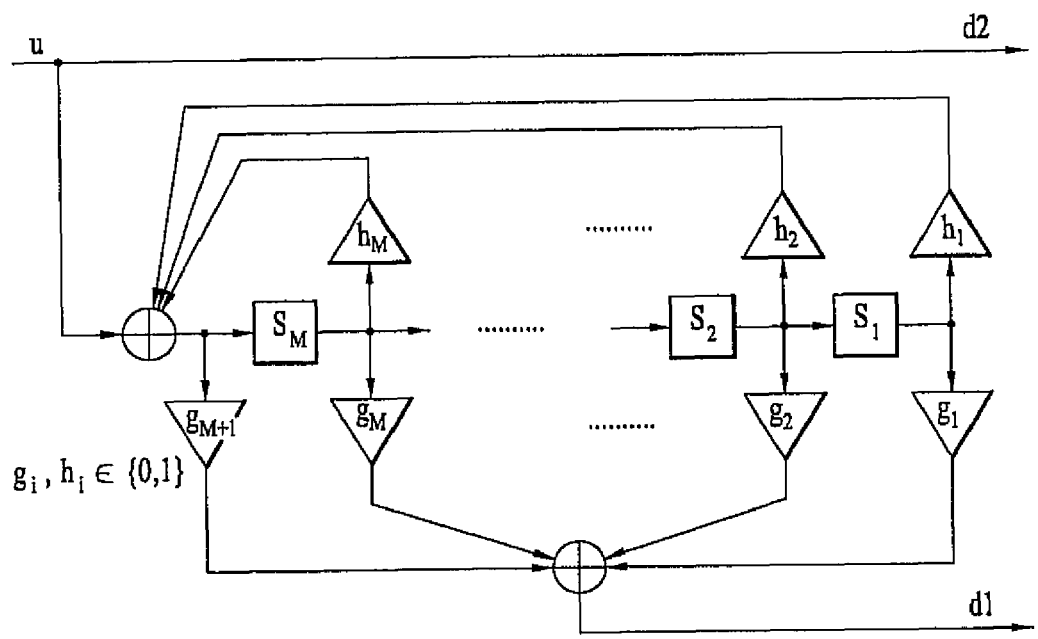
FIG. 7A to FIG. 7C illustrate block views of a systematic convolutional encoder according to another embodiment of the present invention.
Figure 7B:
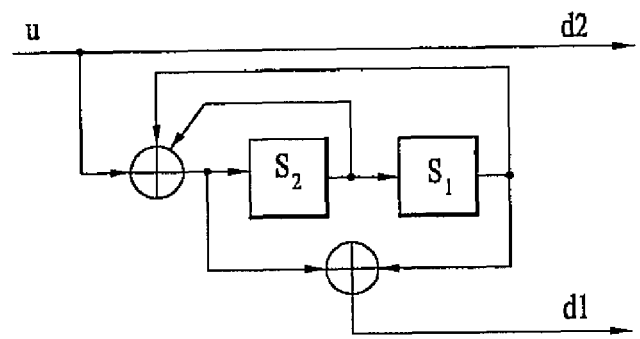
Figure 7C:
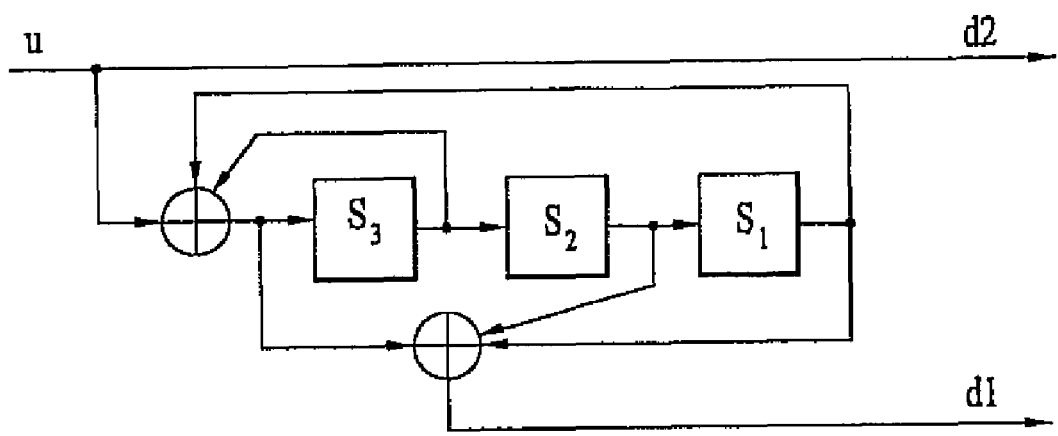

FIG. 7A to FIG. 7C illustrate other different examples of a ½-rate systematic convolutional encoder according to the present invention. The convolutional encoder shown in FIG. 7A to FIG. 7C corresponds to a systematic convolutional encoder which directly outputs the input bit u as the output bit d2 without being changed. More specifically, FIG. 7A illustrates another feedback type ½-rate systematic convolutional encoder having M number of memories. Referring to FIG. 7A, the input of each memory starting from $S_1$ to $S_{M-1}$ corresponds to the value of a previous (left) memory. Meanwhile, in case of the memory $S_M$, the output of each memory starting from $S_1$ to $S_M$ respectively passes through each multiplier $h_1$ to $h_M$, which are then inputted after being modulo added with the input bit u. In addition, the output of each memory $S_1$ to $S_M$ and the input of the memory $S_M$ pass through each multiplier $g_1$ to $g_{M+1}$, which are outputted as the output bit d1 after being modulo added. The characteristic of the convolutional encoder of FIG. 7A is that the output of each memory $S_1$ to $S_M$ may be fed-back and added to the input of the memory $S_M$.

FIG. 7B illustrates an example of the ½-rate systematic convolutional encoder of FIG. 7A having two memories. Herein, FIG. 7B is equivalent to when only the coefficients of the multipliers $g_1$, $g_3$, $h_1$, and $h_2$ of FIG. 7A are equal to '1', and when the coefficients of the remaining multipliers are equal to '0'. Furthermore, FIG. 7C illustrates an example of the ½-rate systematic convolutional encoder of FIG. 7A having three memories. Herein, FIG. 7C is equivalent to when only the coefficients of the multipliers $g_1$, $g_2$, $g_4$, $h_1$, and $h_3$ of FIG. 7A are equal to '1', and when the coefficients of the remaining multipliers are equal to '0'.

Figure 8A:
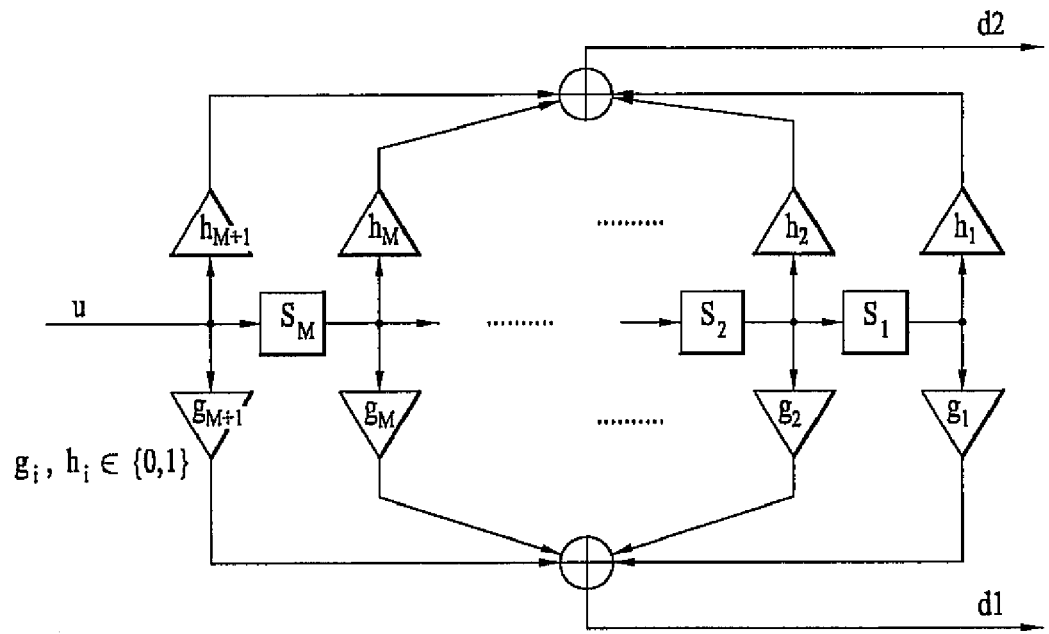
FIG. 8A to FIG. 8C illustrate block views of a non-systematic convolutional encoder according to an embodiment of the present invention.
Figure 8B:
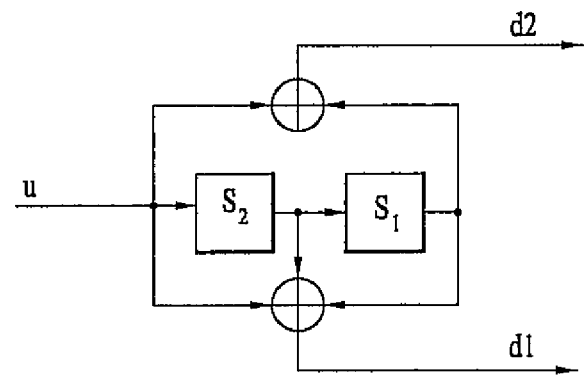
Figure 8C:
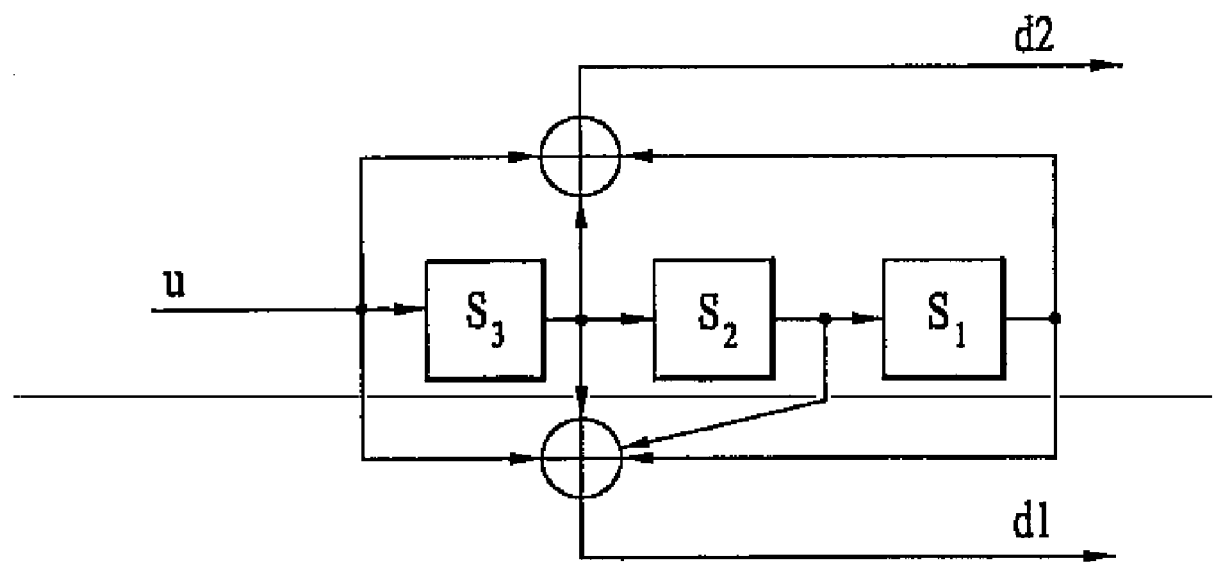

FIG. 8A to FIG. 8C illustrate examples of a ½-rate non-systematic convolutional encoder according to the present invention. The convolutional encoder shown in FIG. 8A to 8C corresponds to a non-systematic convolutional encoder, wherein the input bit u is encoded and outputted as two output bits d1 and d2. FIG. 8A illustrates a type of ½-rate non-systematic convolutional encoder having M number of memories. Referring to FIG. 8A, the input bit u is shifted to each memory $S_M$ to $S_1$. More specifically, the input bit is inputted to the memory $S_M$. Then, the output of the memory $S_M$ is inputted in turn to the memory $S_{M-1}$. Accordingly, the output of each memory is inputted to the each subsequent (or next) memory. Furthermore, when the input bit u and the output bit of each memory $S_M$ to $S_1$ passes through each multiplier $h_{M+1}$ to $h_1$, and is then outputted after being modulo added, the added value becomes the output upper bit d2. Similarly when the input bit u and the output bit of each memory $S_M$ to $S_1$ passes through each multiplier $g_{M+1}$ to $g_1$, and is then outputted after being modulo added, the added value becomes the output lower bit d1.

FIG. 8B illustrates an example of the ½-rate non-systematic convolutional encoder of FIG. 8A having two memories. Herein, FIG. 8B is equivalent to when only the coefficients of the multipliers $g_1$, $g_2$, $g_3$, $h_1$, and $h_3$ of FIG. 8A are equal to '1', and when the coefficients of the remaining multipliers are equal to '0'. Furthermore, FIG. 8C illustrates an example of the ½-rate non-systematic convolutional encoder of FIG. 8A having three memories. Herein, FIG. 8C is equivalent to when only the coefficients of the multipliers $g_1$ to $g_4$, $h_1$, $h_3$, and $h_4$ of FIG. 8A are equal to '1', and when the coefficients of the remaining multipliers are equal to '0'.

Figure 9A:
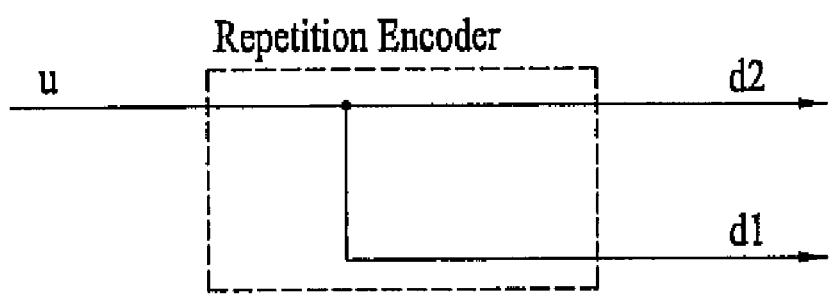
FIG. 9A and FIG. 9B illustrate block views of a ½-rate encoder according to different embodiments of the present invention.
Figure 9B:
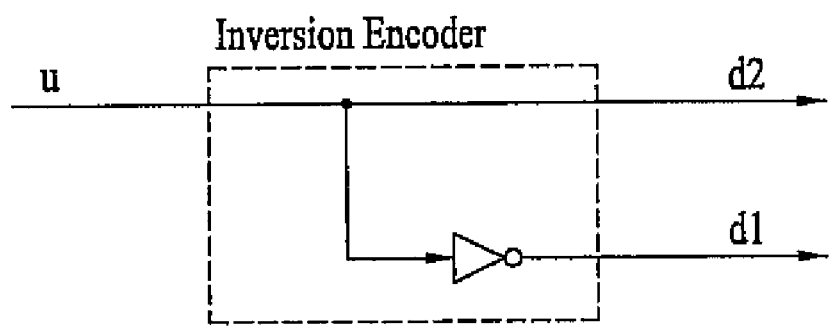

FIG. 9A and FIG. 9B illustrate examples wherein the convolutional encoder is not used as the ½-rate encoder. More specifically, FIG. 9A illustrates an example of a repetition encoder being used as the ½-rate encoder. Herein, the repetition encoder directly outputs the input bit u as two output bits d1 and d2 without any change. Further, FIG. 9B illustrates an example of an inversion encoder being used as the ½-rate encoder. Herein, the inversion encoder directly outputs the input bit u as the output upper bit d2 and, simultaneously, inverses the input bit u so as to be outputted as the output lower bit d1.

As described above, any type of encoder receiving one input bit and outputting the received input bit as two output bits may be used as the ½-rate encoder. Herein, the different types of encoders may include the ½-rate systematic convolutional encoder, the ½-rate non-systematic convolutional encoder, the ½-rate repetition encoder, and the ½-rate inversion encoder. Furthermore, the ½-rate encoder may be used in broader and more diverse applications and is not limited to the above-described examples.

Figure 10:
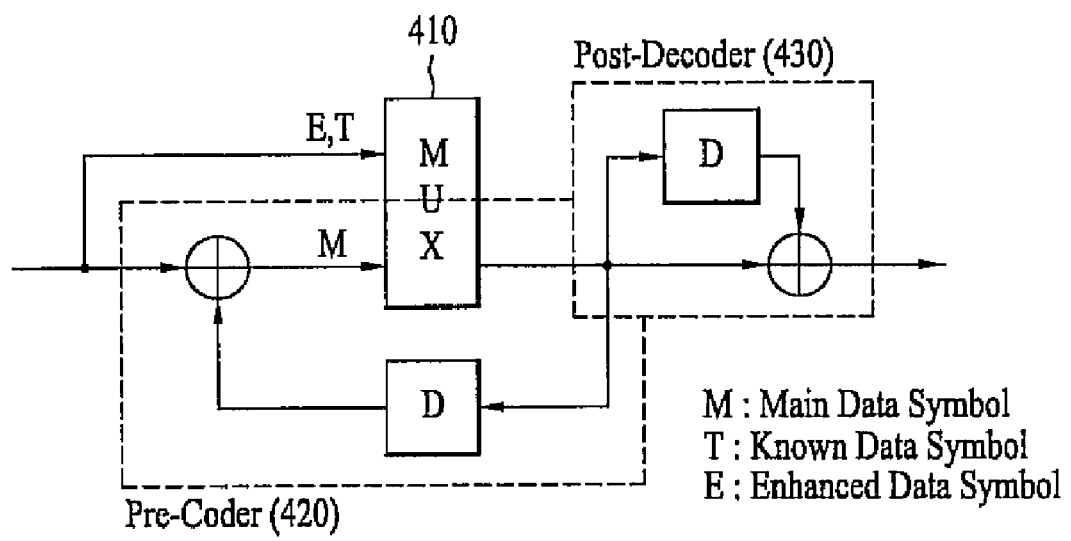
FIG. 10 illustrates a block view of a pre-coder bypass according to an embodiment of the present invention.

Hereinafter, the operation of the pre-coder bypass will now be described in detail with reference to FIG. 10. FIG. 10 illustrates a block view of the pre-coder bypass used in the E-VSB symbol processor of FIGS. 3A and 3B. Referring to FIG. 10, the pre-coder bypass according to the present invention includes a multiplexer 410, a pre-coder 420, and a post-decoder 430. Herein, the post-decoder 430 performs an inverse process of the pre-coder 420. The multiplexer 410 selects either an input bit or an output bit of the pre-coder 420 in accordance with the input data symbol type. Then, the multiplexer 410 outputs the selected input bit or output bit of the pre-coder 420 to the post-decoder 430. If the input data is one of an enhanced data symbol and a known data symbol, the multiplexer 410 selects the input bit. Conversely, if the input data is a main data symbol, the multiplexer 410 selects the output bit of the pre-coder 420. Thereafter, the selected bit is outputted to the post-decoder 430. Accordingly, the post-decoder 430 post-decodes and outputs the output of the multiplexer 410.

If a main data symbol is inputted to the pre-coder bypass of FIG. 10, the inputted main data symbol sequentially passes through the pre-coder 420 and the post-decoder 430. Therefore, a value equal to that of the input bit is outputted. Accordingly, when the main data pass through the pre-coder included in the trellis encoder, the main data is pre-coded. Meanwhile, when the enhanced data symbol and the known data symbol are inputted, the input symbols only pass through the post-decoder 430. This indicates that when the symbols pass though the pre-coder of the trellis encoder, the enhanced data symbol and the known data symbol bypass the pre-coder.

The trellis initialization controller used in the E-VSB symbol processor of FIG. 3A and FIG. 33 initializes the memories M1 and M0 of the trellis encoder to a pre-decided state during the first two symbol periods at the beginning of the known data symbol sequence. The memories of the trellis encoder are initialized so that the known data remain as the known data even after the data are trellis-encoded. Evidently, the known data symbol outputted from the trellis encoder is not identical to the known data symbol inputted to the trellis encoder. Furthermore, since the upper bit of the known data symbol bypasses the pre-coder, the symbol still remains as the known data.

Figure 11:
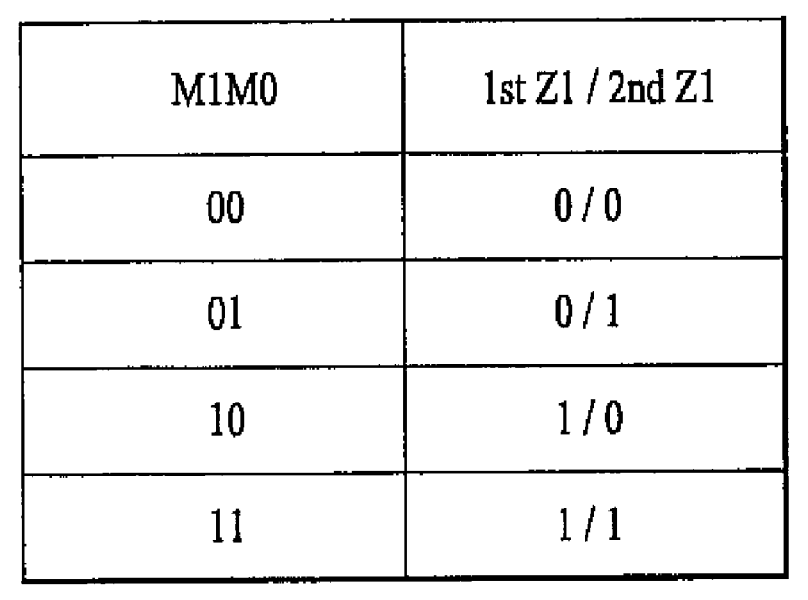

FIG. 11 described the input data of the two symbol periods for initializing the memory M1M0 of the trellis encoder to '00', when the memory M1M0 of the trellis encoder is at an arbitrary state. For example, when the state of the memory M1M0 is equal to '11' (i.e., when M1M0=11), in order to initialize the memory M1M0 to '00', the input bit Z1 should be consecutively inputted as '1' and '1'. Similarly, depending upon the memory state of the trellis encoder during the first two symbols at the beginning of the known data symbol sequence, the trellis initialization controller generates data so that the memory of the trellis encoder can be initialized to a pre-determined state. Thereafter, the data generated from the trellis initialization controller are outputted instead of the input data. Subsequently, the remaining portion of the input data are bypassed and outputted.

Figure 12A:
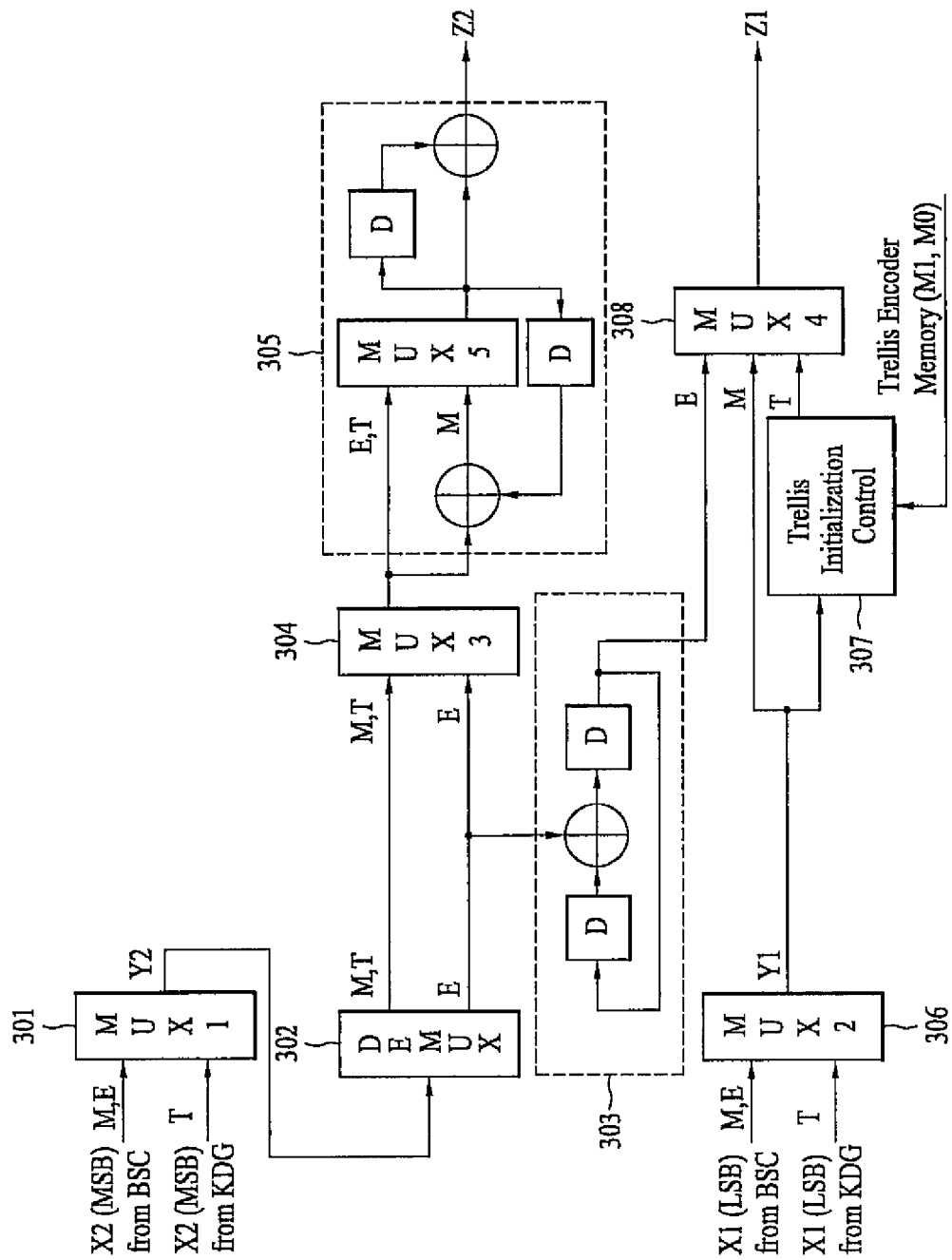
FIG. 12A illustrates an example of the convolutional encoder of FIG. 6B and the pre-coder bypass of FIG. 10 being applied to the E-VSB symbol processor of FIG. 3A.
Figure 12B:
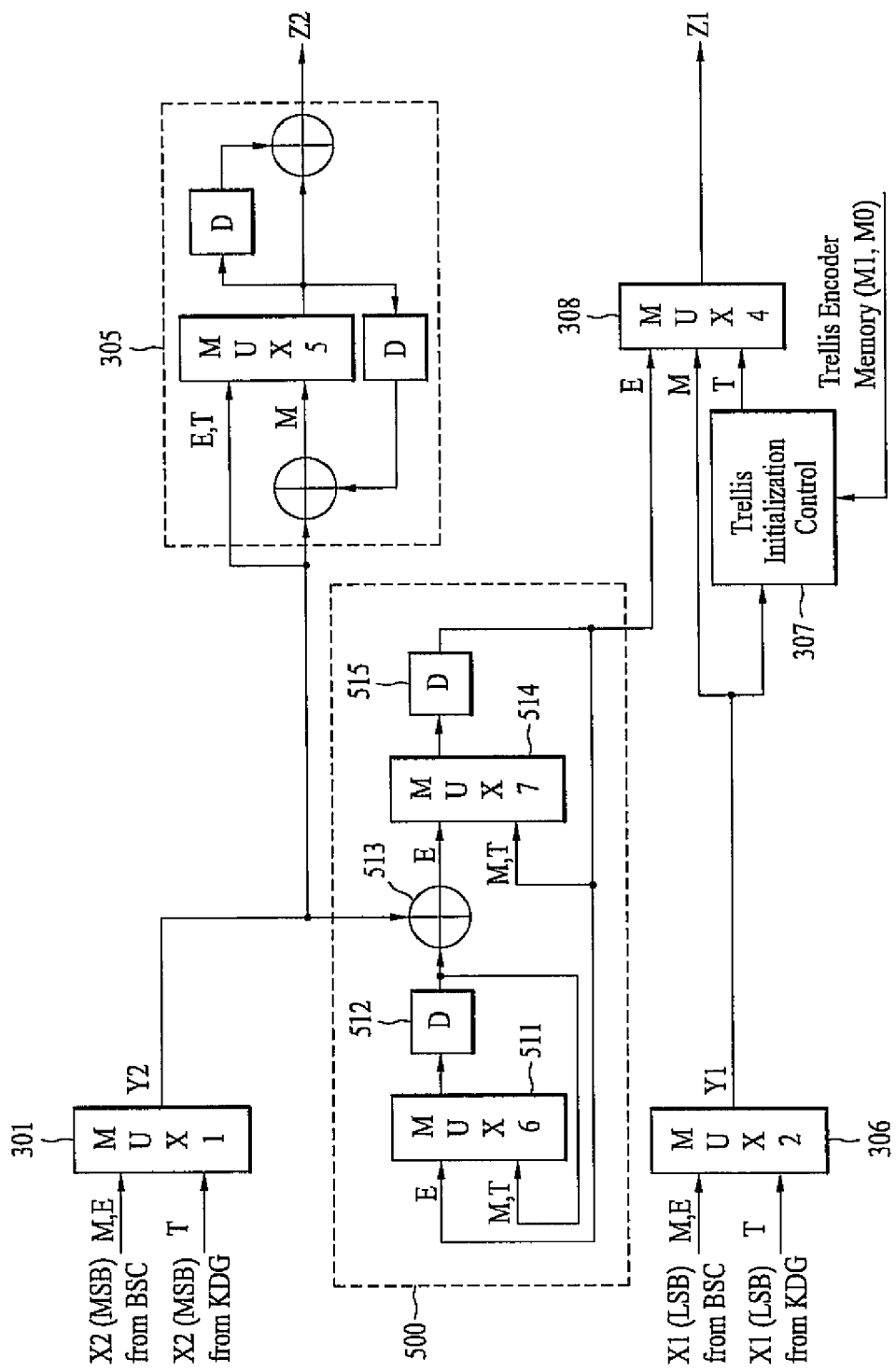
FIG. 12B illustrates an equivalent drawing performing the operations identical to those of FIG. 12A.

FIG. 12A illustrates an example of the convolutional encoder of FIG. 6B and the pre-coder bypass of FIG. 10 being applied to the E-VSB symbol processor of FIG. 3A. FIG. 12B illustrates an equivalent drawing of FIG. 12A performing the operations equivalent to those of FIG. 12A. Herein, the demultiplexer 302, ½-rate encoder 303, and the third multiplexer 304 of FIG. 12A are equivalent to the encoder 500 of FIG. 12B, and the operation the above-mentioned components of FIG. 12A is also identical (or equivalent) to the operation of the encoder 500 of FIG. 12B. The encoder 500 of FIG. 12B includes a sixth multiplexer 511, a first memory 512, an adder 513, a seventh multiplexer 514, and second memory 515.

More specifically, when the input data correspond to the enhanced data, the sixth multiplexer 511 selects the first input E and outputs the selected first input E to the first memory 512. Alternatively, when the input data correspond to one of the main data and the known data, the sixth multiplexer 511 selects the second input M, T and outputs the selected second input M, T to the first memory 512. The data delayed by one symbol from the first memory 512 are outputted to the adder 513 and simultaneously fed-back as a second input of the sixth multiplexer 511. The adder 513 adds the input upper bit Y2 and the output of the first memory 512, which are then outputted to the seventh multiplexer 514 as the first input. Herein, when the input data correspond to the enhanced data, the seventh multiplexer 514 selects the output data of the adder 513 and outputs the selected output data to the second memory 515. Alternatively, when the input data correspond to one of the main data and the known data, the seventh multiplexer 514 selects the fed-back data M, T and outputs the selected data to the second memory 515. The second memory 515 delays the input data by one symbol and outputs the delayed data to the fourth multiplexer 308 and simultaneously feeds back the input data to the sixth multiplexer 511 as the first input and to the seventh multiplexer 514 as the second input.

If the input data symbol corresponds to the enhanced data symbol, the fourth multiplexer 308 selects the output of the encoder 500. And, if the input data symbol corresponds to the main data symbol, the fourth multiplexer 308 selects the output Y1 of the second multiplexer 306. Finally, if the input data symbol corresponds to the known data symbol, the fourth multiplexer 308 selects the output of the trellis initialization controller 307. Referring to FIG. 12A and FIG. 12B, the main data symbol and the known data symbol are not coded with a ½-rate, whereas the enhanced data symbol is coded with a ½-rate. At this point, the upper bit X2 of the enhanced input symbol is post-decoded and outputted as the output upper bit Z2. On the other hand, the lower bit X1 is discarded (or deleted). And, instead of the discarded lower bit X1, the outcome (or output) of the upper bit X2 being convolutional-coded with a ½ coding rate is outputted as the output lower bit Z1.

Figure 13:
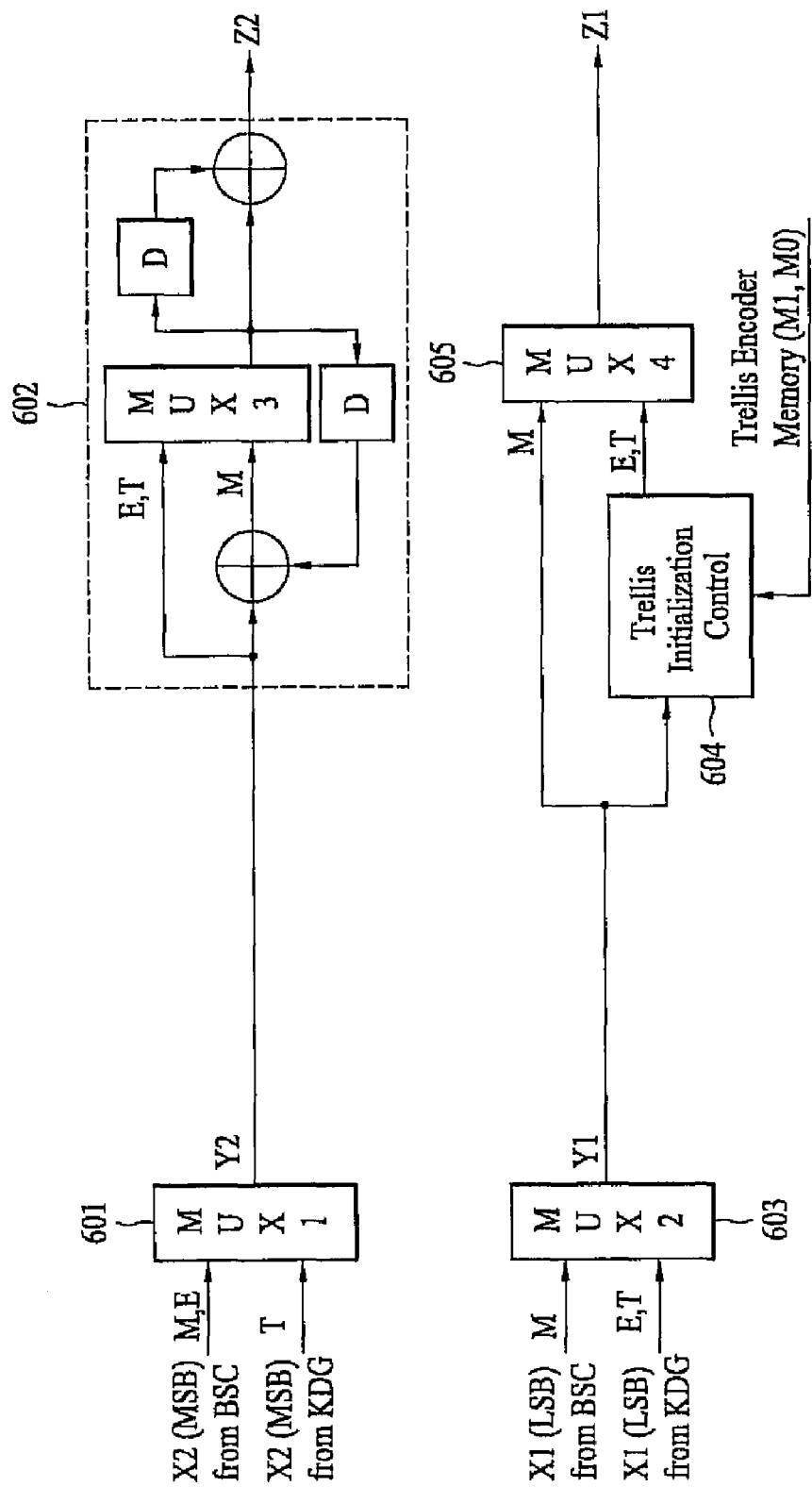
FIG. 13 illustrates an E-VSB symbol processor according to another embodiment of the present invention.

FIG. 13 illustrates an example of the E-VSB symbol processor according to the present invention transmitting the lower bit of the enhanced data as the known data. Referring to FIG. 13, if the inputted symbol corresponds to the main data symbol or the enhanced data symbol, the first multiplexer 601 selects the upper bit X2 of the symbol being outputted from the byte-symbol converter 108 and outputs the selected upper bit X2 to the pre-coder bypass 602. Alternatively, it the inputted symbol corresponds to the known data symbol, the first multiplexer 601 selects the upper bit X2 of the symbol being outputted from the known data generator 110 and outputs the selected upper bit X2 to the pre-coder bypass 602.

If the inputted symbol corresponds to the main data symbol, the second multiplexer 603 selects the lower bit X1 of the symbol being outputted from the byte-symbol converter 108. If the inputted symbol corresponds to the enhanced data symbol or the known data symbol, the second multiplexer 603 selects the lower bit X1 of the symbol being outputted from the known data generator 110. Thereafter, the second multiplexer 603 respectively outputs the selected lower bit X1 to the trellis initialization controller 604 and the fourth multiplexer 605. In other words, when the enhanced data symbol is inputted, the second multiplexer 603 selects and outputs the lower bit of the known data symbol instead of the lower bit of the enhanced data symbol.

If the input data correspond to the enhanced data symbol or the known data symbol, the pre-coder bypass 602 post-decodes and outputs the corresponding input data. This is to enable the pre-coder to be bypassed in the trellis encoder 113 in a later process. Alternatively, if the input data correspond to the main data symbol, the input data are directly outputted as Z2 without any change. When the input symbol corresponds to the main data symbol, the fourth multiplexer 605 selects the output bit Y1 of the second multiplexer 603 and outputs the selected output bit Y1 as Z1. Further, when the input symbol corresponds to the enhanced data symbol or the known data symbol, the fourth multiplexer 605 selects and outputs the output of the trellis initialization controller 604.

The trellis initialization controller 604 generates data initializing the memory of the trellis encoder 113 during the first two symbol periods at the beginning of the known data symbol sequence and outputs the generated data as Z1. Additionally, the trellis initialization controller 604 generates data during the first two symbol periods at the beginning of the enhanced data symbol sequence, so that the memory of the trellis encoder 113 can be initialized, and outputs the generated data as Z1. Subsequently, during the remaining symbol periods, the output bit Y1 of the second multiplexer 603 is bypassed and outputted as Z1. Accordingly, when the enhanced data symbol is trellis-encoded and outputted, the output bits C1 and C0 may correspond to the known data.

According to the signal mapping of FIG. 2, when C1C0 of the enhanced symbol is '00', the level of the output symbol may only correspond to '−7' and '+1'. Therefore, in the receiver, C2 of the enhanced symbol may be determined based upon a 2-level slicer. Therefore, the slicing performance may be enhanced. Meanwhile, since the upper bit of the enhanced symbol bypasses the pre-coder, C2 becomes X2 of the enhanced symbol. If the trellis initialization is not performed during the first two symbol periods at the beginning of the enhanced data symbol sequence in the trellis initialization controller 605, and the enhanced data symbol is trellis-encoded, among the output bits, only C1 corresponds to the known data. Subsequently, in the E-VSB pre-processor of FIG. 13, the lower bit of the enhanced data symbol is replaced with the known data and outputted. Therefore, in the E-VSB pre-processor, the byte expansion is performed as shown in FIG. 4A or FIG. 4C when the coding rate is ½, and the byte expansion is performed as shown in FIG. 5A or FIG. 5C when the coding rate is ¼.

Figure 14:
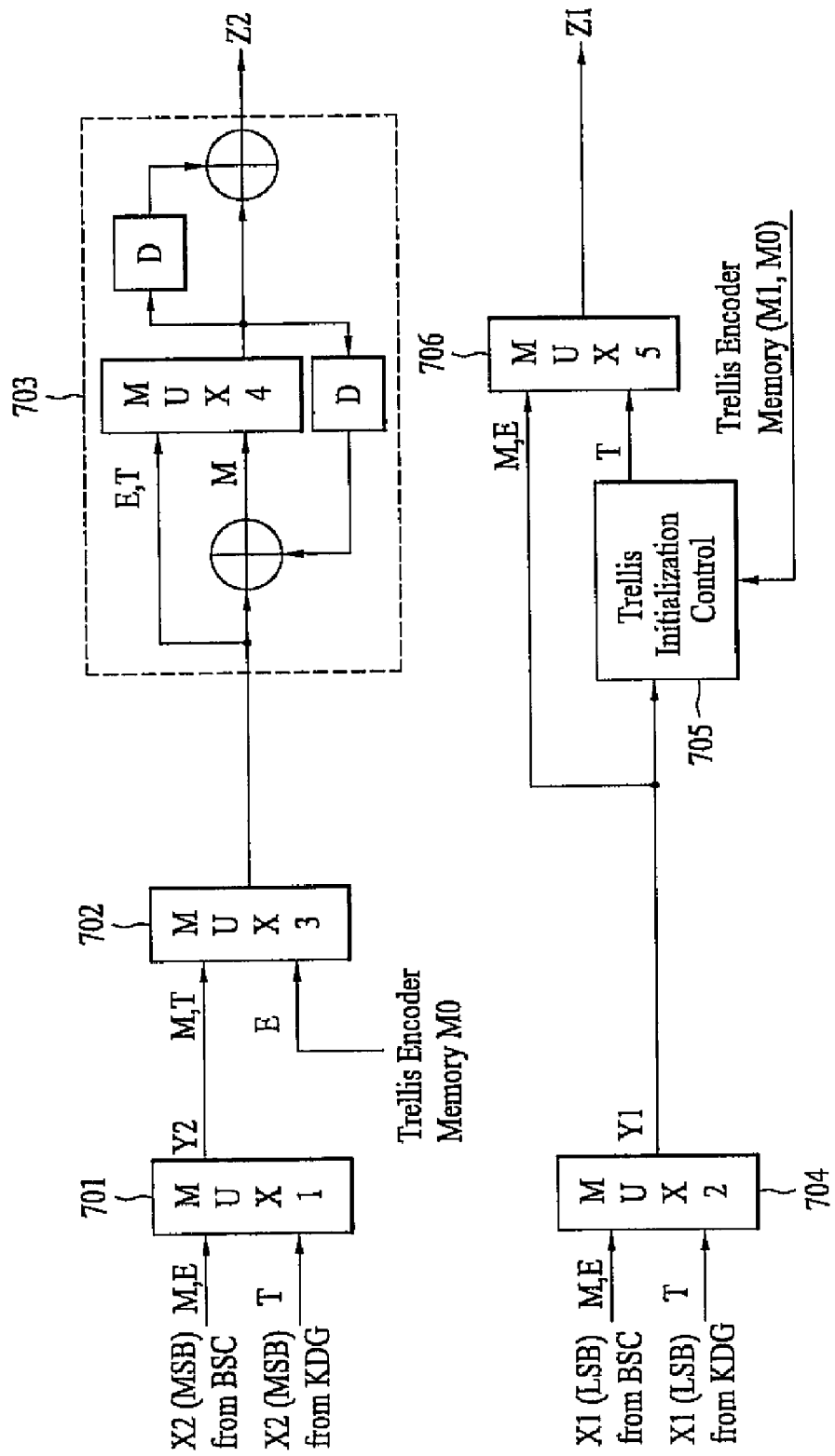
FIG. 14 illustrates an E-VSB symbol processor according to yet another embodiment of the present invention.

FIG. 14 illustrates an example of the E-VSB symbol processor according to the present invention. Herein, when the enhanced data symbol is trellis-encoded, the E-VSB symbol processor enables output bits C2 and C0 to be equal to one another among the three output bits. Referring to FIG. 14, if the symbol being inputted corresponds to the main data symbol or the enhanced data symbol, the first multiplexer 701 selects the upper bit of the symbol being outputted from the byte-symbol converter and outputs the selected upper bit to the third multiplexer 702. Alternatively, if the symbol being inputted corresponds to the known data symbol, the first multiplexer 701 selects the upper bit of the symbol being outputted from the known data generator and outputs the selected upper bit to the third multiplexer 702.

Similarly, if the symbol being inputted corresponds to the main data symbol or the enhanced data symbol, the second multiplexer 704 selects the lower bit of the symbol being outputted from the byte-symbol converter and outputs the selected lower bit to the fifth multiplexer 706. Alternatively, if the symbol being inputted corresponds to the known data symbol, the second multiplexer 704 selects the lower bit of the symbol being outputted from the known data generator and outputs the selected lower bit to the trellis initialization controller 705. In addition, if the output of the first multiplexer 701 corresponds to the enhanced data symbol, the third multiplexer 702 selects the output of the memory M0 of the trellis encoder instead of the output of the first multiplexer 701 and outputs the selected output to the pre-coder bypass 703. On the other hand, if the output of the first multiplexer 701 corresponds to the main data symbol or the known data symbol, the third multiplexer 702 selects the output of the output of the first multiplexer 701 and outputs the selected output to the pre-coder bypass 703.

If the input data correspond to the enhanced data symbol or the known data symbol, the pre-coder bypass 703 post-decodes and outputs the input data as Z2. Alternatively, if the input data correspond to the main data symbol, the input data is directly outputted as Z2 without any change in the data. Furthermore, if the input symbol corresponds to the main data symbol or the enhanced data symbol, the fifth multiplexer 706 selects and outputs the output of the second multiplexer 704 as Z1. Alternatively, if the input symbol corresponds to the known data symbol, the fifth multiplexer 706 selects the output of the trellis initialization encoder 705 and outputs the selected output as Z1. The trellis initialization controller 705 generates and outputs data for initializing the memory of the trellis encoder during the first two symbol periods at the beginning of the known data symbol sequence. Subsequently, during the remaining symbol periods, the output bit Y1 of the second multiplexer 704 is bypassed and outputted as Z1.

When using the E-VSB symbol processor of FIG. 14, and when the enhanced data symbol is trellis-encoded and outputted, C2 and C0 are always identical to one another. Accordingly, among the 8 VSB signal levels, only '+7', '+3', '−3', and '−7' may be outputted. In the E-VSB symbol processor of FIG. 14, the upper bit of the enhanced data symbol is replaced with the memory M0 of the trellis encoder. Therefore, in the E-VSB pre-processor, the byte expansion is performed as shown in FIG. 4B or FIG. 4C when the coding rate is ½, and the byte expansion is performed as shown in FIG. 5B or FIG. 5C when the coding rate is ¼. As described above, 12 of the above-described E-VSB symbol processor should be provided in the present invention, each E-VSB symbol process corresponding to each of the 12 trellis encoders used in the ATSC VSB system.

As described above, the digital television (DTV) transmitter and the method of coding main and enhanced data in the DTV transmitter according to the present invention have the following advantages. More specifically, the digital television (DTV) transmitter and the method of coding main and enhanced data in the DTV transmitter according to the present invention is highly protected against (or resistant to) any error that may occur when transmitting supplemental data through a channel. And, the present invention is also highly compatible to the conventional VSB receiving system. Moreover, the present invention may also receive the supplemental data without any error even in channels having severe ghost effect and noise.

Additionally, by inserting known data in a specific area of the data area and transmitting the processed data, the receiving performance of the DTV receiver liable to a frequent change in channel may be enhanced. The present invention is even more effective when applied to mobile and portable receivers, which are also liable to a frequent change in channel and which require protection (or resistance) against intense noise. Furthermore, ½-rate coding is additionally performed on the enhanced data symbol, which bypasses the pre-coder so as to be outputted. Thus, the problems of noise and ghost effect in the channel may be enhanced. Finally, by outputting the known data as the lower bit of the enhanced data symbol and trellis-encoding the outputted lower bit, or by outputting the memory value of the trellis encoder as the upper bit of the enhanced data symbol and trellis-encoding the outputted memory value, the slicing performance of the receiver may also be enhanced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A digital television (DTV) transmitter for coding main and enhanced data, the DTV transmitter comprising:
   a byte-symbol converter for converting main data packets and enhanced data packets into symbols, the enhanced data packets including at least enhanced data bytes or data place holder bytes for known data symbols;
   a known data generator for generating a known data symbol;
   a symbol processor for processing a first symbol of the symbols output from the byte-symbol converter, the symbol processor post-decoding a first bit of the known data symbol generated by the known data generator and outputting the post-decoded first bit of the known data symbol and an initialization data bit when the first symbol is a symbol converted from the data place holder bytes; and
   a trellis encoder having one or more memories for trellis-encoding a second symbol output from the symbol processor, wherein the trellis encoder pre-codes the post-decoded first bit of the known data symbol, and wherein the one or more memories are initialized when the initialization data bit is processed in the trellis encoder.

2. The DTV transmitter of claim 1, wherein the symbol processor bypasses the first symbol outputted from the byte-symbol converter when the first symbol is a main data symbol.

3. The DTV transmitter of claim 1, wherein the symbol processor bypasses the first symbol outputted from the byte-symbol converter when the first symbol is an MPEG header symbol.

4. The DTV transmitter of claim 1, wherein the symbol processor bypasses the first symbol outputted from the byte-symbol converter when the first symbol is an RS parity symbol.

5. The DTV transmitter of claim 1, wherein the symbol processor codes a first bit of the first symbol with a coding rate of ½ to generate first and second coded bits, post-decodes the first coded bit, and outputs the post-decoded bit and the second coded bit to the trellis encoder when the first symbol is an enhanced data symbol.

6. The DTV transmitter of claim 1, wherein the symbol processor convolution-codes an upper bit of the first symbol with a coding rate of ½ to generate first and second coded bits, post-decodes the first coded bit, and outputs the post-decoded bit and the second coded bit to the trellis encoder when the first symbol is an enhanced data symbol.

7. The DTV transmitter of claim 1, wherein the symbol processor convolution-codes a lower bit of the first symbol with a coding rate of ½ to generate first and second coded bits, post-decodes the first coded bit, and outputs the post-decoded bit and the second coded bit to the trellis encoder when the first symbol is an enhanced data symbol.

8. The DTV transmitter of claim 1, wherein the first bit of the known data symbol is processed as an upper bit in the symbol processor.

9. The DTV transmitter of claim 1, wherein the first symbol is any one of two foremost symbols among a sequence of the symbols converted from the data place holder bytes.

10. The DTV transmitter of claim 1, wherein the initialization data bit is predetermined based on previous values of the memories included in the trellis encoder.

11. A digital television (DTV) transmitter for coding main and enhanced data, the DTV transmitter comprising:
    a byte-symbol converter for converting main data packets and enhanced data packets into symbols, the enhanced data packets including at least enhanced data bytes or data place holder bytes for known data symbols;
    a known data generator for generating a known data symbol;
    a symbol processor for processing a first symbol of the symbols output from the byte-symbol converter, the symbol processor post-decoding an upper bit of the first symbol and outputting the post-decoded upper bit of the first symbol and an initialization data bit when the first symbol is an enhanced data symbol; and
    a trellis encoder having one or more memories for trellis-encoding a second symbol of the symbols output from the symbol processor, wherein the trellis encoder pre-codes the post-decoded upper bit of the first symbol, and wherein the one or more memories are initialized when the initialization data bit is processed in the trellis encoder.

12. The DTV transmitter of claim 11, wherein the symbol processor post-decodes an upper bit of the known data symbol and outputs the post-decoded upper bit of the known data symbol and the initialization data bit to the trellis encoder when the first symbol is a symbol converted from the data place holder bytes.

13. The DTV transmitter of claim 11, wherein the first symbol is any one of two foremost symbols among a sequence of the symbols converted from the enhanced data bytes.

14. The DTV transmitter of claim 11, wherein the initialization data bit is predetermined based on previous values of the memories included in the trellis encoder.

15. The DTV transmitter of claim 11, wherein the symbol processor bypasses the first symbol outputted from the byte-symbol converter when the first symbol is a main data symbol.

16. The DTV transmitter of claim 11, wherein the symbol processor bypasses the first symbol outputted from the byte-symbol converter when the first symbol is an MPEG header symbol.

17. The DTV transmitter of claim 11, wherein the symbol processor bypasses the first symbol outputted from the byte-symbol converter when the first symbol is an RS parity symbol.

18. A digital television (DTV) transmitter comprising:
    a processor for encoding enhanced data for first error correction;
    a packet formatter for generating enhanced data packets including the encoded enhanced data and at least one known data sequence;
    a multiplexer for multiplexing the enhanced data packets with main data packets including main data;
    a Reed-Solomon (RS) encoder for encoding the multiplexed main and enhanced data packets for second error correction, the RS encoder RS coding the main data packets with a systematic RS encoding scheme and RS coding the enhanced data packets with a non-systematic RS encoding scheme;
    a data interleaver for interleaving the RS-coded main and enhanced data packets; and
    a trellis encoder having one or more memories for trellis-encoding the interleaved main and enhanced data packets,
    wherein the one or more memories are initialized with initialization data when a beginning of the at least one known data sequence is output from the data interleaver, and wherein the initialization data are determined based on previous values of the one or more memories included in the trellis encoder.

19. The DTV transmitter of claim 18, further comprising:
a convolutional encoder for convolutional encoding the enhanced data with a coding rate of M/L, L being greater than M.

20. The DTV transmitter of claim 19, wherein the enhanced data are convolutional-encoded with a coding rate of ½.

21. The DTV transmitter of claim 19,
wherein the convolutional encoder outputs two output bits from an input bit of the enhanced data,
wherein the input bit of the enhanced data is input to an XOR gate, an output of the XOR gate is input to a first memory, an output of the first memory is input to a second memory, and an output of the second memory is input to the XOR gate,
wherein the input bit of the enhanced data corresponds to one output bit of the two output bits, and
wherein the output of the first memory corresponds to the other output bit of the two output bits.

22. A method of processing a broadcast signal in a digital television (DTV) transmitter comprising:
encoding enhanced data for first error correction;
generating enhanced data packets including the encoded enhanced data and at least one known data sequence;
multiplexing the enhanced data packets with main data packets including main data;
encoding the multiplexed main and enhanced data packets for second error correction by a RS encoder, the RS encoder RS coding the main data packets with a systematic RS encoding scheme and RS coding the enhanced data packets with a non-systematic RS encoding scheme;
interleaving the RS-coded main and enhanced data packets by a data interleaver; and
trellis-encoding the interleaved main and enhanced data packets and initializing one or more memories included in a trellis encoder with initialization data when a beginning of the at least one known data sequence is output from the data interleaver,
wherein the initialization data are determined based on previous values of the one or more memories included in the trellis encoder.

23. The method of claim 22, further comprising:
convolutional encoding the enhanced data with a coding rate of M/L, L being greater than M.

24. The method of claim 23, wherein the enhanced data are convolutional-encoded with a coding rate of ½.

* * * * *